United States Patent
Qian et al.

(10) Patent No.: US 10,491,245 B2
(45) Date of Patent: Nov. 26, 2019

(54) METHOD AND APPARATUS FOR GRID MAPPING IN A WIRELESS COMMUNICATION SYSTEM

(71) Applicant: Samsung Electronics Co., Ltd., Suwon-si, Gyeonggi-do (KR)

(72) Inventors: Chen Qian, Beijing (CN); Qi Xiong, Beijing (CN); Bin Yu, Beijing (CN); Jingxing Fu, Beijing (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 15/680,942

(22) Filed: Aug. 18, 2017

(65) Prior Publication Data
US 2018/0054218 A1  Feb. 22, 2018

(30) Foreign Application Priority Data

Aug. 19, 2016 (CN) .......................... 2016 1 0697575

(51) Int. Cl.
*H03M 13/27* (2006.01)
*H04W 64/00* (2009.01)
(Continued)

(52) U.S. Cl.
CPC ......... *H03M 13/271* (2013.01); *H03M 13/27* (2013.01); *H04L 5/005* (2013.01);
(Continued)

(58) Field of Classification Search
CPC . H03M 13/271; H03M 13/27; H04W 64/006; H04W 88/06; H04W 84/045; H04L 5/005; H04L 5/0048
See application file for complete search history.

(56) References Cited

U.S. PATENT DOCUMENTS

2008/0160953 A1* 7/2008 Mia ..................... H04M 7/0057
455/404.2
2013/0176860 A1* 7/2013 Wolcott ............ H04L 25/03019
370/242
(Continued)

FOREIGN PATENT DOCUMENTS

WO    2015197376 A1    12/2015

OTHER PUBLICATIONS

International Search Report and Written Opinion regarding International Application No. PCT/KR2017/009006, dated Dec. 5, 2017, 11 pages.
(Continued)

*Primary Examiner* — Guy J Lamarre

(57) ABSTRACT

The present disclosure relates to a pre-5th-Generation (5G) or 5G communication system to be provided for supporting higher data rates Beyond 4th-Generation (4G) communication system such as Long Term Evolution (LTE). Methods and apparatuses for grid mapping are described. A method for operating a base station comprises configuring grid mapping patterns for a plurality of terminals, transmitting, to the plurality of terminals, the grid mapping patterns, receiving, from the plurality of terminals, information on which a grid mapping is performed based on the grid mapping patterns, and identifying data of the information corresponding to each of the plurality of terminals based on the grid mapping patterns. Therefore, the terminal can hold a low peak-to-average power ratio, and the power consumption can be effectively saved. The base station can complete signal detection in a moderate detection complexity by multi-terminal joint detection. The detection complexity and the performance are balanced.

20 Claims, 24 Drawing Sheets

(51) Int. Cl.
H04W 84/04 (2009.01)
H04W 88/06 (2009.01)
H04L 5/00 (2006.01)

(52) U.S. Cl.
CPC ....... *H04W 64/006* (2013.01); *H04W 84/045* (2013.01); *H04W 88/06* (2013.01); *H04L 5/0048* (2013.01)

(56) References Cited

U.S. PATENT DOCUMENTS

| | | | | |
|---|---|---|---|---|
| 2014/0087758 | A1* | 3/2014 | Maor | G01S 5/0252 455/456.1 |
| 2014/0133593 | A1 | 5/2014 | Lim et al. | |
| 2015/0358648 | A1* | 12/2015 | Limberg | H04L 27/2627 725/109 |
| 2015/0382327 | A1 | 12/2015 | Kishiyama et al. | |
| 2016/0161591 | A1* | 6/2016 | Wirola | G01S 5/0252 455/456.1 |
| 2017/0230138 | A1* | 8/2017 | Xiong | H04L 1/0003 |
| 2018/0054270 | A1* | 2/2018 | Xiong | H04J 11/0053 |

OTHER PUBLICATIONS

Samsung, "Non-orthogonal Multiple access candidate for NR", 3GPP TSG RAN WG1 Meeting #85, R1-163992, May 2016, 7 pages.

Nokia et al., "Overview of the proposed non-orthogonal MA schemes", 3GPP TSG RAN WG1 Meeting #85, R1-165018, May 2016, 7 pages.

3GPP TR 38.802 V14.1.0 (Jun. 2017), 3rd Generation Partnership Project; Technical Specification Group Radio Access Network; Study on New Radio Access Technology Physical Layer Aspects (Release 14), 143 pages.

3GPP TR 38.913 V14.2.0 (Mar. 2017), 3rd Generation Partnership Project; Technical Specification Group Radio Access Network; Study on Scenarios and Requirements for Next Generation Access Technologies (Release 14), 38 pages.

International Telecommunication Union, Radiocommunication Study Groups, Document 5D/TEMP/466-E, Oct. 21, 2014, "SWG Traffic, Working Document Towards a Preliminary Draft New Report ITU-R M.[IMT.BEYOND2020.Traffic], IMT Traffic estimates beyond year 2020," 35 pages.

International Telecommunication Union, Recommendation ITU-R M.2083-0 (Sep. 2015), "IMT Vision Framework and overall objectives of the future development of IMT for 2020 and beyond," M Series, Mobile, radiodetermination, amateur and related satellite services, 21 pages.

International Telecommunication Union, Report ITU-R M.2320-0 (Nov. 2014), "Future technology trends of terrestrial IMT systems," M Series, Mobile, radiodetermination, amateur and related satellite services, 32 pages.

Ping, Li, et al., "Interleave-Division Multiple-Access," IEEE Transactions on Wireless Communications, vol. 5, No. 4, Apr. 2006, pp. 938-947.

Tuchler, Michael, et al., "Minimum Mean Squared Error Equalization Using a Priori Information," IEEE Transactions on Signal Processing, vol. 50, No. 3, Mar. 2002, pp. 673-683.

* cited by examiner

METHOD AND APPARATUS FOR GRID MAPPING IN A WIRELESS COMMUNICATION SYSTEM

CROSS-REFERENCE TO RELATED APPLICATIONS AND CLAIM OF PRIORITY

This application is related to and claims priority to Chinese Application No. 201610697575.2 filed on Aug. 19, 2016, the contents of which are incorporated herein by reference.

TECHNICAL FIELD

The present disclosure relates to a wireless communication system, and more specifically, relates to methods and apparatuses for grid mapping in a wireless communication system.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The rapid development of information industry, particularly the increasing demand from the mobile Internet and the Internet of Things (IoT), brings about unprecedented challenges in the future mobile communications technology. According to the ITU-R M. [IMT.BEYOND 2020. TRAFFIC] issued by the International Telecommunication Union (ITU), it can be expected that, by 2020, mobile services traffic will grow nearly 1,000 times as compared with that in 2010 (4G era), and the number of user apparatuses connections will also be over 17 billion, and with a vast number of IoT devices gradually expand into the mobile communication network, the number of connected apparatuses will be even more astonishing. In response to this unprecedented challenge, the communications industry and academia have prepared for 2020s by launching an extensive study of the fifth generation of mobile communications technology (5G). Currently, in ITU-R M. [IMT.VISION] from ITU, the framework and overall objectives of the future 5G have been discussed, where the demands outlook, application scenarios and various important performance indexes of 5G have been described in detail. In terms of new demands in 5G, the ITU-R M. [IM FUTURE TECHNOLOGY TRENDS] from ITU provides information related to the 5G technology trends, which is intended to address prominent issues such as significant improvement on system throughput, consistency of the user experience, scalability so as to support IoT, delay, energy efficiency, cost, network flexibility, support for new services and flexible spectrum utilization, etc.

The demand of supporting massive Machine-Type Communication (mMTC) is proposed for 5G. The connection density will reach millions of connections per square kilometer, considerably higher than the link density supported by the existing standards. The existing orthogonal multiple access modes, for example, Orthogonal Frequency Division Multiple Access (OFDMA), cannot satisfy the demand of millions of connections to be achieved by mMTC in 5G. To improve the capacity of the multiple access technology, some Non-orthogonal Multiple Access (NoMA) technologies have been proposed, and discussed as the potential 5G key technologies in the 3GPP standard conferences. Among those technologies, CDMA-based access modes such as Sparse Code Multiple Access (SCMA), Pattern Defined Multiple Access (PDMA) and Multi-user Shared Access (MUSA), and interleaving-based access modes such as Interleave Division Multiple Access (IDMA) and Interleave-Grid Multiple Access (IGMA), are included. When compared with the orthogonal multiple access modes, by using non-orthogonal access resources, for example, non-orthogonal codebooks, interleaved sequences or more, those access technologies can allow more users to access on the limited time-frequency resources, so that the number of apparatuses connected in a unit area is significantly increased, and the demands of massive scenarios in 5G are satisfied.

Terminals in mMTC have special requirements on the cost and power consumption. Generally, terminals in mMTC scenarios are low in cost and require long battery life. The requirement on the UE life in mMTC scenarios was proposed by the 3GPP in [TR38.913:Study on scenarios and requirements for next generation access technologies]. The UE should last for 15 years on the premise of satisfying a certain amount of uplink and downlink data transmission, without charging. This proposes high requirements on the power consumption of mMTC terminals. Considering that the Peak-to-Average Power Ratio (PAPR) of the output signals has great influence on the power consumption of terminals, the lower the PAPR, the lower the power consumption.

SUMMARY

To address the above-discussed deficiencies, it is a primary object to provide the following technical solutions.

One embodiment of the present disclosure provides a multi-terminal information receiving method based on grid mapping, comprising the following steps of:

configuring a grid mapping pattern, and transmitting the grid mapping pattern to each terminal;

performing RF-to-baseband processing on received information data of each terminal, the information data being superimposed via channels; and processing the information data by a multi-terminal joint detector, and distinguishing each terminal based on the grid mapping pattern to determine the information data corresponding to each terminal.

Another embodiment of the present disclosure provides a multi-terminal information transmitting method based on grid mapping, comprising the following steps of:

receiving a configured grid mapping pattern;

performing channel coding on information data to obtain a corresponding coded sequence;

performing symbol modulation on the coded sequence to obtain a modulated symbol sequence;

performing grid mapping on the modulated symbol sequence based on the grid mapping pattern;

performing multi-carrier modulation on the sequence passing through the grid mapping to obtain a corresponding modulated sequence; and performing baseband-to-RF processing on the modulated sequence, and then transmitting the sequence.

Still another embodiment of the present disclosure provides a multi-terminal information receiving apparatus based on grid mapping, comprising:

a configuration unit for configuring a grid mapping pattern, and transmitting the grid mapping pattern to each terminal;

a RF-to-baseband processing unit for performing RF-to-baseband processing on received information data of each terminal, the information data being superimposed via channels; and a detection unit for processing the information data by a multi-terminal joint detector based on the grid mapping pattern to obtain the processed information data corresponding to each terminal.

Yet another embodiment of the present disclosure provides a multi-terminal information transmitting apparatus based on grid mapping, comprising:

a receiving unit for receiving a configured grid mapping pattern;

a channel coding unit for performing channel coding on information data to obtain a corresponding coded sequence;

a symbol modulation unit for performing symbol modulation on the coded sequence to obtain a modulated symbol sequence;

a grid mapping unit for performing grid mapping on the modulated symbol sequence based on the grid mapping pattern;

a multi-carrier modulation unit for performing multi-carrier modulation on the sequence passing through the grid mapping to obtain a corresponding modulated sequence; and a transmission unit for performing baseband-to-RF processing on the modulated sequence, and then transmitting the sequence.

By the method of the present disclosure, an information transmitting end can hold a low peak-to-average power ratio, and a high flexibility of selection of multiple access resources is provided. Meanwhile, due to a low peak-to-average power ratio, the power consumption can be effectively saved. The method of the present disclosure is applicable to low-cost mMTC scenarios. Further, a receiving end in the present disclosure can complete signal detection in a moderate detection complexity by multi-terminal joint detection. The detection complexity and the performance are balanced.

Additional aspects and advantageous of the present disclosure will be appreciated and become apparent from the descriptions below, or will be well learned from the practice of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

THE DESCRIPTION OF DRAWINGS

For a more complete understanding of the present disclosure and its advantages, reference is now made to the following description taken in conjunction with the accompanying drawings, in which like reference numerals represent like parts:

DETAILED DESCRIPTION

FIGS. 1 through 24, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Most of the existing non-orthogonal multiple access modes are combined directly with Orthogonal Frequency Division Multiplex (OFDM), so they have the problem of high PAPR and high terminal power consumption.

Figure 1:
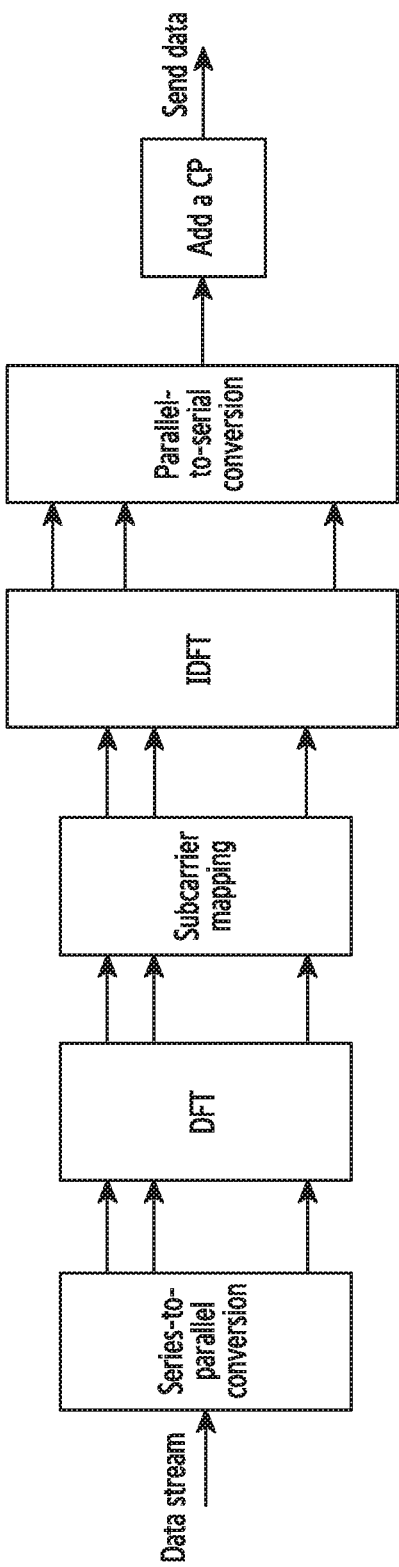
FIG. 1 illustrates a block diagram of SC-FDMA.

In the existing wireless communication standards, for example, LTE-A, the way of reducing the PAPR is to use single-carrier frequency division multiple access (SC-FDMA), i.e., DFT-spread-OFDM (DFT-s-OFDM), the block diagram of which is shown in FIG. 1.

When in comparison with OFDM, in SC-FDMA, DFT precoding is performed before the IDFT, and subcarrier mapping is then performed. Generally, the number of points of DFT should not be greater than the number of points of IDFT. If the number of points of DFT is equal to the number of points of IDFT, the transmitted data is consistent with the data stream to be processed. The PAPR of the original data stream can be maintained. If the number of points of DFT is less than the number of points of IDFT and the subcarrier mapping module selects successive subcarriers for mapping, the output data still can be maintained in a certain single-carrier structure, and the PAPR thereof still can be reduced when compared with OFDM.

Figure 2:
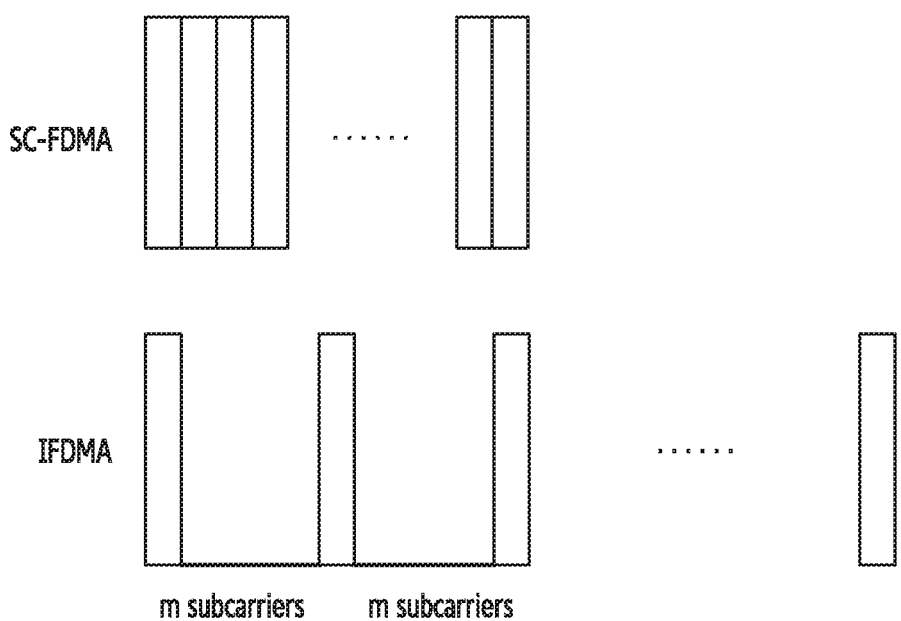
FIG. 2 illustrates a schematic diagram of subcarrier mapping.

The interleaved FDMA (IFDMA) can be regard as an evolution form of SC-FDMA. The difference from SC-FDMA lies in that the subcarrier mapping is mapping having an equal distance. That is, the symbols to be mapped are mapped to subcarriers having a distance m. The subcarrier mapping modes for SC-FDMA and IFDMA are as shown in FIG. 2.

For IFDMA, if $N_{IDFT}=mN_{DFT}$ and the distance for subcarrier mapping is m, it can be proved that the input symbol x(n) and the output symbol s(n) satisfy the following formula:

$$s[n] = \sqrt{\frac{1}{m}} \times [n \bmod N_{DFT}], 0 \leq n \leq N_{IDFT}$$

That is, the signal passing through IFDMA is the periodic repetition of the input signal after scaling-down. Therefore, a same PAPR as the input signal can be maintained for the output signal. If the horizontal amplitude modulation is performed on the input signal, for example, QPSK or PSK, the output signal can obtain a PAPR of 0 dB. The power consumption of the output signal is greatly reduced.

Because of the detector, it is difficult to easily combine the currently proposed multiple access modes with low-PAPR modulation modes. Whereas, the multiple access modes combined with OFDM have high PAPR due to the waveform, and thus cannot satisfy the requirements on low cost and low terminal power consumption in mMTC scenarios.

Embodiments of the present disclosure will be described in detail hereafter. The examples of these embodiments have been illustrated in the drawings throughout which same or similar reference numerals refer to same or similar elements or elements having same or similar functions. The embodiments described hereafter with reference to the drawings are illustrative, merely used for explaining the present disclosure and should not be regarded as any limitations thereto.

Figure 3:
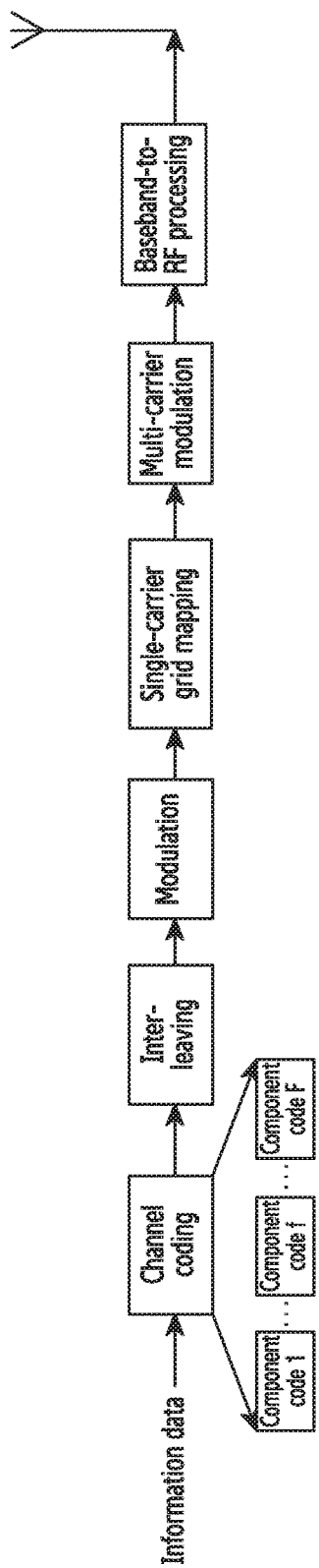
FIG. 3 illustrates a block diagram of a transmitter system of single-carrier interleave-grid multiple access mode.

First, the multi-terminal information transmitting principle based on grid mapping as provided by the present disclosure will be simply described. The block diagram of a transmitter system in accordance with this principle is as shown in FIG. 3.

Channel coding is first performed on information data to obtain coded data. The channel coding can be single channel coding, and also can be a cascade of multiple kinds of channel coding. The channel coding comprises: a Turbo code, a LDPC code, simple block coding, a repetition code, etc. Symbol data is obtained by optional bit-level interleaving and modulation, and then single-carrier grid mapping is performed. The single-carrier grid mapping contains: optional symbol-level interleaving, DFT (discrete Fourier transform) precoding, and frequency-domain grid mapping. Wherein, the optional symbol-level interleaving and the DFT precoding can be exchanged in position, and can be contained in the frequency-domain grid mapping. In addition, in order to provide the low peak-to-average power ratio characteristic of the output data, the frequency-domain grid mapping is completed in the frequency domain by mapping at distances. That is, the selected frequency points have an equal distance. The data is passed through single-carrier grid mapping, then OFDM modulation, then baseband-to-RF processing, and finally transmitted.

Embodiment 1

Figure 4:
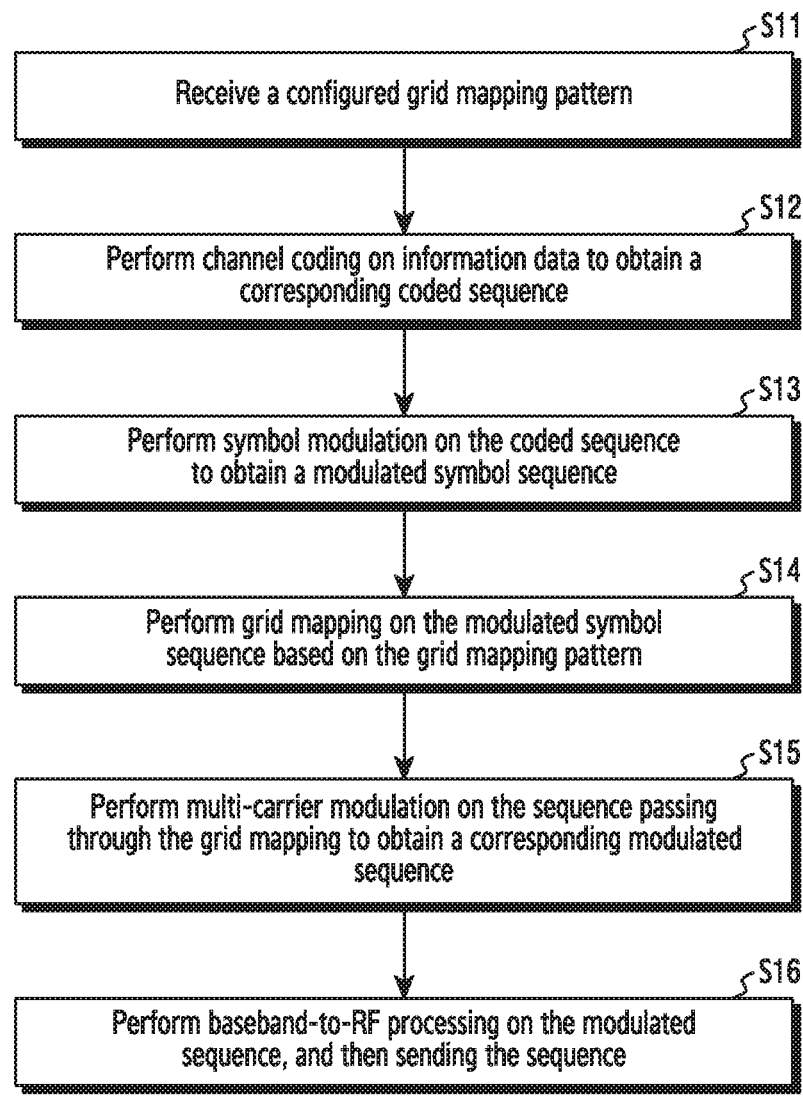
FIG. 4 illustrates a schematic diagram of a flow of a multi-terminal information transmitting method based on grid mapping according to one embodiment of the present disclosure.

Based on the principle, referring to FIG. 4, the present disclosure provides an embodiment of a multi-terminal information transmitting method based on grid mapping, comprising the following steps of:

S11: receiving a configured grid mapping pattern;

S12: performing channel coding on information data to obtain a corresponding coded sequence;

S13: performing symbol modulation on the coded sequence to obtain a modulated symbol sequence;

S14: performing grid mapping on the modulated symbol sequence based on the grid mapping pattern;

S15: performing multi-carrier modulation on the sequence passing through the grid mapping to obtain a corresponding modulated sequence; and S16: performing baseband-to-RF processing on the modulated sequence, and then transmitting the sequence.

Figure 5:
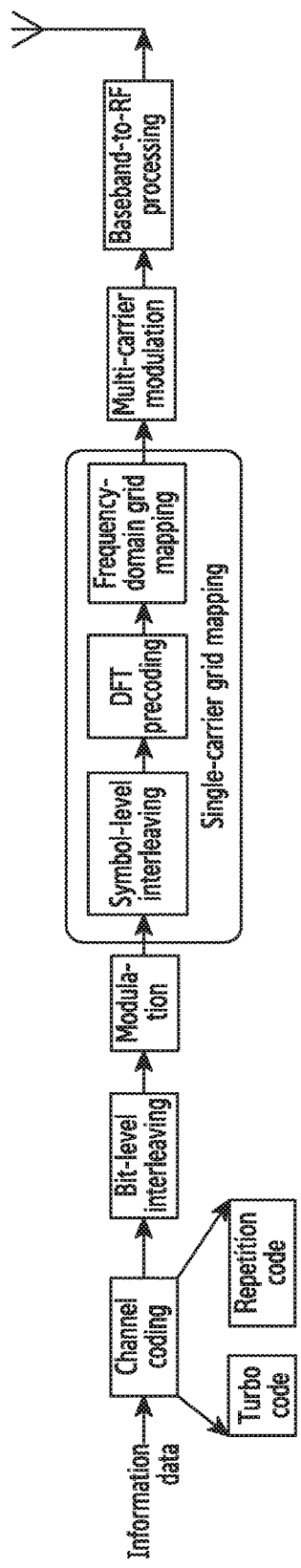
FIG. 5 illustrates the structure of a single-carrier interleave-grid multiple access transmitter according to one embodiment of the present disclosure.

In this embodiment, to describe the method steps more conveniently, the structure of a transmitter for transmitting a terminal signal will be introduced by specific parameters. The basic block diagram of the transmitter is as shown in FIG. 5.

For a multiple access system, the system supports K terminals on the same time-frequency resources. For the $k^{th}$ terminal, it is assumed that the length of information data stream to be transmitted by the terminal is M=144 bits, and the bit sequence is $d_k = \{d_k(m), m=0, \ldots, M-1\}$. First, channel coding is performed on the data stream first. In the example shown in FIG. 5, the channel coding contains a Turbo code and a repetition code cascaded thereto. First, a bit sequence $d_k$ is coded by a Turbo code having a coding rate of $R_1 = 1/2$ in accordance with the LTE standard, the resulting coded sequence is repeatedly coded with a coding rate of $R_2 = 1/2$ to obtain a coded sequence $c_k = \{c_k(n), n=0, \ldots, N-1\}$, having an equivalent coding rate of $R = R_2 R_1 = 1/4$. The length of the sequence is N=M/R=576 bits. Bit-level interleaving is performed on the coded sequence $c_k$, to obtain an interleaved sequence $x_k = \{x_k(n), n=0, \ldots, N-1\}$. The effect of the bit-level interleaving is to change the arrangement order of bits in the bit sequence. The bit-level interleaving for the $k^{th}$ terminal is denoted by an interleaved sequence $\pi_{k,b} = [p_1, p_2, \ldots p_N]$, where $[p_1, p_2, \ldots, p_N]$ is one arrangement of a number sequence $[1, \ldots, N]$. The interleaving operation can be denoted by $x_k(\pi_{k,b}) = c_k$. After the bit-level interleaving, modulation with a modulation order Q is performed on the interleaved sequence to obtain a symbol sequence $s_k = \{s_k(l), l=0, \ldots, L-1\}$). The length L of the symbol sequence is determined collectively by the length N of the interleaved sequence and the modulation order Q. For the modulation way having a modulation order Q, there are total Q constellation points in a constellation point set, and every $B = \log_2 Q$ bits are mapped to one symbol. Therefore, the length of the symbol sequence is denoted by L=N/B.

Single-carrier grid mapping is performed on the symbol sequence $s_k$ passing through the symbol modulation. The single-carrier grid mapping is used for sparsely mapping a symbol stream carrying terminal information to time-frequency resources, and a data stream having a low peak-to-average power ratio is generated after multi-carrier modulation.

To realize this purpose, the grid mapping is performed in the following way in the present disclosure.

Optionally, the grid mapping comprises at least one of the following:

Performing DFT precoding on the modulated symbol sequences, respectively, to obtain corresponding equivalent frequency-domain sequences, and then performing frequency-domain grid mapping; and performing time-domain grid mapping on the modulated symbol sequences, then performing DFT precoding, and performing resource mapping on the obtained results so that the obtained results are mapped to subcarrier resources having a specific distance.

Specifically, FIG. 5 shows a first implementation. First, symbol-level interleaving is performed on a symbol sequence to obtain a sequence $g_k = \{g_k(l), l=0, \ldots, L-1\}$. The symbol-level interleaving can be denoted by $\pi_{k,s} = [p_1, p_2, \ldots, p_L]$, where $[p_1, p_2, \ldots, p_L]$ is one arrangement of a number sequence $[1, \ldots, L]$. The symbol-level interleaving operation can be denoted by $g_k(\pi_{k,s}) = s_k$. After the symbol-level interleaving, DFT precoding is performed on the resulted sequence to obtain an equivalent frequency-domain sequence $f_k = \{f_k(l), l=0, \ldots, N_{DFT}-1\}$. The DFT precoding can be implemented by $N_{DFT}$ point FFT. Meanwhile, the number of points $N_{DFT}$ of FFT is no less than the length L of the sequence passing through the symbol interleaving. If the length L is less than the number of points $N_{DFT}$ of FFT, zeros are padded at the end of the symbol sequence so that its length reaches $N_{DFT}$. After obtaining the equivalent frequency-domain sequence $f_k$, frequency-domain grid mapping is performed thereon. The frequency-domain grid mapping is used for sparsely mapping the equivalent frequency-domain sequence to the time-frequency resources according to the allocated grid mapping pattern and causing the equivalent frequency-domain sequence to obtain a time-frequency waveform by which a low peak-to-average power ratio can be obtained. It is assumed that the number of IDFT points in the subsequent multi-carrier modulation is $N_{IDFT}$, and $N_{IDFT} = mN_{DFT}$, where m is a positive number no less than 1. Further, if m is an integer, the peak-to-average power ratio can be reduced more significantly in the ways described below. However, if m is not an integer, the ways described in this embodiment can also work well.

Regarding the implementation mode of grid mapping, the frequency-domain grid mapping is implemented in any one of the following ways:

directly mapping the equivalent frequency-domain sequences to the pre-defined subcarrier resources having a frequency-domain distance;

performing grid mapping based on the allocated codebook; and inserting a specific number of zeros between every two symbols in the equivalent frequency-domain sequences, and mapping the obtained sequences to the subcarrier resources in order.

Specifically, the implementation mode of the frequency-domain grid mapping will be described below.

Figure 6:
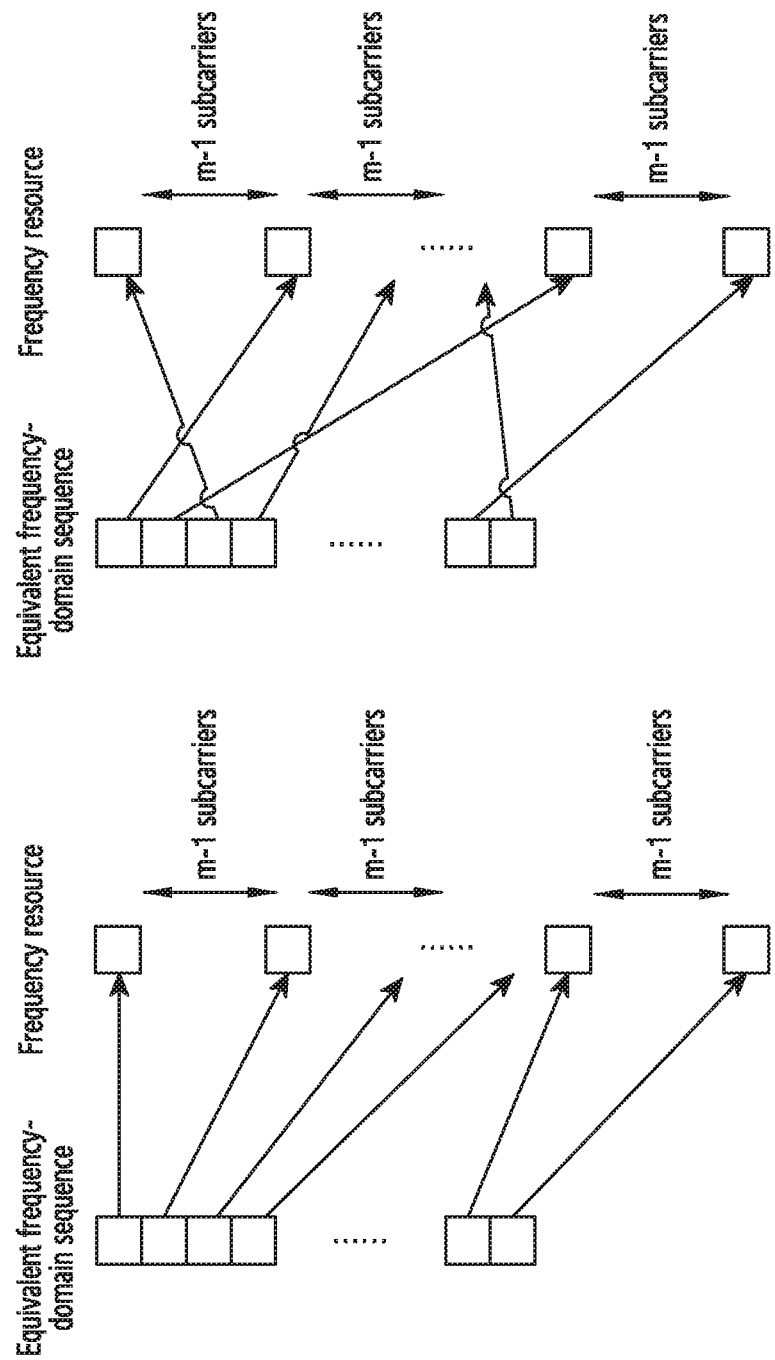
FIG. 6 illustrates a frequency-domain grid mapping in the form of direct mapping.
Figure 7:
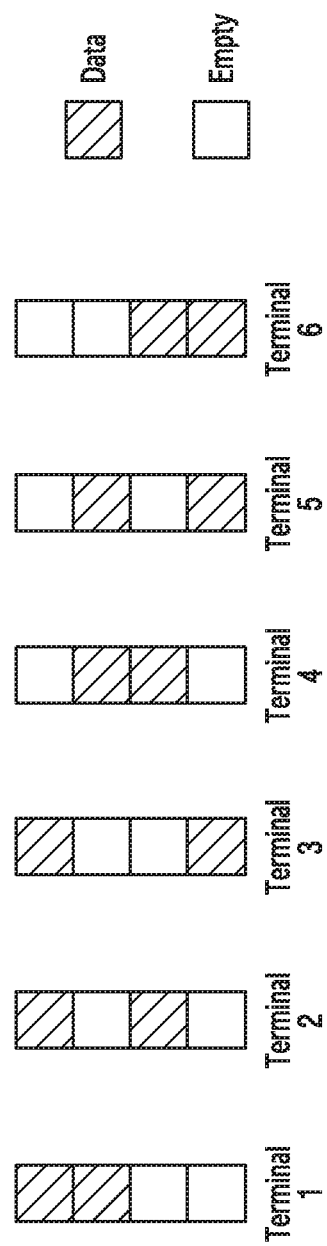
FIG. 7 illustrates an example of a possible codebook.

1. The equivalent frequency-domain sequences are directly mapped to frequency-domain resources having a frequency-domain distance m−1, i.e., subcarriers. Meanwhile, m is defined as the mapping distance. FIG. 6 shows a possible mapping mode.

In FIG. 6, each symbol in the frequency-domain sequences is mapped to subcarriers having a distance m−1 in order. In FIG. 6, each symbol in the equivalent frequency-domain sequences is mapped to subcarriers having a distance m−1 according to a pre-defined or allocated mapping rule. The mapping rule is allocated by a base station to each terminal, or acquired by a terminal by randomly selecting from a pre-defined resource pool.

2. Codebook-based mapping. Before the transmission of resources, a different codebook is allocated to each terminal, and the terminal maps the equivalent frequency-domain sequences to subcarriers having a distance m−1 according to the allocated codebook. A preferred implementation is as follows: the codebook is allocated to a terminal in the form of a matrix or a vector; and the terminal performs codebook mapping according to the allocated codebook to obtain sequences based on codebook mapping and then maps the sequences passing through the codebook mapping to subcarriers having a distance m−1. For example, the codebook specifies the positions of $m_b$ non-zero symbols among $m_a$ successive symbols during the resource (subcarrier) mapping. Taking $m_a$=4 and $m_b$=2 as an example, one possible codebook allocated to a multiple of users is as shown in FIG. 6.

Wherein, the performing grid mapping based on the allocated codebook is implemented in any one of the following mapping modes:

mapping symbol sequence to a mapping position specified by the codebook;

spreading each symbol in the symbol sequence in a way specified by the codebook, and then mapping the symbol to a mapping position specified by the codebook;

repeatedly mapping each symbol in the symbol sequence to a position of a non-zero symbol determined by the symbol before mapping, and then adjusting amplitude and phase at this position according to the codebook; and selecting a codeword in the codebook according to a bit sequence, and mapping the symbol sequence to a respective position of the codeword.

The way of performing codebook-based grid mapping in the present disclosure includes any one of the above modes, and will not be repeated hereafter. In a specific embodiment, the way of codebook-based grid mapping will be described below.

In FIG. 6, every two successive symbols in an equivalent frequency-domain sequence are mapped to four resources. According to a different allocated codebook, the mapping positions of two symbols from different terminals are different. For example, the codebook allocated to terminal 1 has resource positions 1 and 2; the codebook allocated to terminal 4 has resource positions 2 and 3; and the codebook allocated to terminal 6 has resource positions 3 and 4. During the codebook mapping, every $m_b$ successive symbols in an equivalent frequency-domain sequence are mapped to $m_a$ symbols according to the allocated codebook. The mapped sequence becomes longer, and zeros are contained in the mapped sequence. After the codebook mapping, the sequences containing zeros are successively mapped to the frequency (subcarrier) resources having a distance m−1. The codebook-based frequency-domain grid mapping process can be shown in FIG. 7.

The codebook-based mapping is to map symbols in the equivalent frequency-domain sequences to mapping positions specified by the codebook. Another codebook-based mapping mode is as follows: symbols in each equivalent frequency-domain sequence are repeated for $m_b$ times and then mapped to $m_a$ symbols. This is equivalent to spreading. Also taking the example of FIG. 6 as an example, each symbol in an equivalent frequency-domain sequence is repeated twice, and then mapped to non-empty subcarriers as shown in FIG. 6. Specifically, each symbol of terminal 1 is repeated twice and mapped to the resource positions 1 and 2 of every four subcarriers; and each symbol of terminal 4 is repeated twice and mapped to the resource positions 2 and 3 of every four subcarriers; and so forth. In other words, each symbol in an equivalent frequency-domain sequence is spread in a way specified by the codebook to obtain a mapped sequence. In addition, it is to be noted that, among the codebooks as shown in FIG. 6, for the codebook for each terminal, the ratio of the number of non-empty resources and the total number of resources is consistent in the codebooks. However, in order to support more terminals, a different ratio of the number of non-empty resources and the total number of resources can be used for the codebooks for different terminals.

In the foregoing two codebook-based mapping modes, the amplitude and phase of symbols do not change. Another codebook-based mapping mode is as follows: a codeword sequence is selected according to each symbol before mapping. The codeword sequence may occupy $m_a$ symbols of $m_b$ successive symbols, and the value of the $m_a$ non-zero symbols depends upon the symbols before mapping. A simple implementation is as follow: first, each symbol is repeatedly mapped to $m_a$ symbols of $m_b$ successive symbols according to the codebook, and then the amplitude and phase of the $m_a$ symbols are adjusted according to the symbols before mapping and the allocated or selected codebook. In this implementation, a codebook sequence and a codeword sequence can be directly specified, a different codebook is allocated to each terminal, and the terminal selects a codeword in the codebook according to a bit group.

3. m−1 zeros are inserted between every two symbols in the equivalent frequency-domain sequences, and the obtained sequences are mapped to the frequency (subcarrier) resources in order.

Among the above several methods, the concept of density is introduced in Method 2. The density can be defined as $p=m_b/m_a$. In the codebook example of FIG. 6, the density is 0.5. Whereas, in the frequency-domain grid mapping shown in Method 1 and Method 3, the corresponding concept of density is still used. Since the equivalent frequency-domain sequences take all available frequency resources having a distance m−1, the density in the two modes is 1.

After the frequency-domain grid mapping, a sequence $t_k=\{t_k(l), l=0, \ldots, N_{IDFT}-1\}$ having a length $N_{IDFT}$ is obtained, and then multi-carrier modulation operation is performed thereon. Taking OFDM modulation as an example, IDFT operation is performed on a sequence $t_k$. The IDFT operation can be implemented by $N_{IDFT}$-point IFFT. Some other multi-carrier modulation techniques, for example, filtering-based OFDM operation or windowing-based OFDM operation and etc., are also applicable to the implementations of the present disclosure. After the multi-carrier modulation, baseband-to-RF conversion is performed on the sequence, after passing the sequence through up-conversion and digital-to-analog conversion (DAC), a RF signal is obtained and transmitted to a receiver.

It is to be noted that, in the above examples, both the bit-level interleaving and the symbol-level interleaving are optional operations. If a base station does not configure different bit-level interleaving and/or symbol-level interleaving for different terminals, the terminals can perform bit-level interleaving and/or symbol-level interleaving in a pre-defined interleaving way, or do not perform bit-level interleaving and/or symbol-level interleaving in accordance with a pre-defined rule. In addition, the bit-level interleaving and/or symbol-level interleaving in the above implementations can be replaced with bit-level scrambling and/or symbol-level scrambling.

The grid mapping in the first mode consists of symbol-level interleaving, DFT precoding and frequency-domain grid mapping. The grid mapping in the second mode will be introduced in detail below.

First, grid mapping is performed on the modulated symbol sequence $s_k = \{s_k(l), l=0, \ldots, L-1\}$, DFT precoding is performed on the sequence passing through the grid mapping, and resource mapping is performed on the obtained results so that the obtained results are mapped to frequency (subcarrier) resources having a distance m. This single-carrier grid mapping implementation can be shown in FIG. 8.

The grid mapping is used for generating a sparse sequence containing zeros according to the allocated grid mapping pattern and the symbol sequence. The density of the sequence passing through the grid mapping is defined as the ratio of the number of non-zero symbols in the sequence and the length of the sequence.

Optionally, the time-domain grid mapping is implemented in any one of the following ways:

according to the allocated grid mapping density information, supplementing a specific number of zeros at the end of a symbol sequence, and then performing specific symbol-level interleaving;

inserting zeros in the symbol sequence according to inserting positions specified by an allocated grid pattern;

obtaining the length of the mapped sequence according to the allocated grid mapping density information and the length of the symbol sequence, generating the mapped sequence of all zeros, and then mapping each symbol in the symbol sequence to a corresponding position of the mapped sequence of all zeros according to a mapping rule for the allocated grid pattern; and performing grid mapping based on the allocated codebook.

Specifically, the implementation of the time-domain grid mapping will be described below.

a. Zeros are Padded at the End of the Symbol Sequence, and then Symbol-Level Interleaving is Performed.

According to the allocated density information, a corresponding number of zeros are padded at the end of the modulated symbol sequence, and then symbol-level interleaving specific to the terminal is performed. Still taking the grid mapping pattern having a density 0.5 as an example, for a symbol sequence having a length L, L zeros are padded at the end of the symbol sequence, and symbol-level interleaving having a length 2 L is performed.

b. Zeros are directly inserted in the symbol sequence.

First, optional symbol-level interleaving is performed on the symbol sequence, and then zeros are inserted in the corresponding positions of the sequence according to the allocated grid pattern.

c. A sequence passing through the grid mapping is obtained by direct mapping.

According to the allocated grid pattern, a mapped sequence is obtained by direct mapping. Specifically, the length of the mapped sequence is obtained according to the allocated grid mapping density information and the length of the symbol sequence, an empty mapped sequence (a sequence of all zeros) is generated, and then each symbol in the symbol sequence is mapped to a corresponding position of the mapped sequence according to a mapping rule for the allocated grid pattern. Specifically, if the density of the grid mapping pattern is 0.5, an empty mapped sequence (a sequence of all zeros) having a length 2 L is generated first, and then each symbol in the symbol sequence having a length L is mapped to a corresponding position of the sequence having a length 2 L according to the grid mapping pattern.

d. Codebook-based grid mapping

A mapped sequence is obtained according to the allocated codebook. Specifically, the codebook specifies the positions of $m_b$ non-zero symbols among $m_a$ successive symbols in the mapped sequence. Taking the codebook of FIG. 6 as an example, there are two non-zero symbols and two zeros in four successive symbols. During the grid mapping, every two successive symbols in the sequence are mapped to four symbols according to the codebook to obtain the mapped sequence. In order to increase the randomness of mapping, it is possible to perform symbol-level interleaving before mapping, and then perform codebook-based grid mapping.

Another codebook-based grid mapping is as follows: each symbol in the symbol sequence is spread in a way specified by the codebook. For example, each symbol in the symbol sequence is mapped to a non-empty position of the codebook of FIG. 16 to obtain the mapped sequence.

Figure 8:
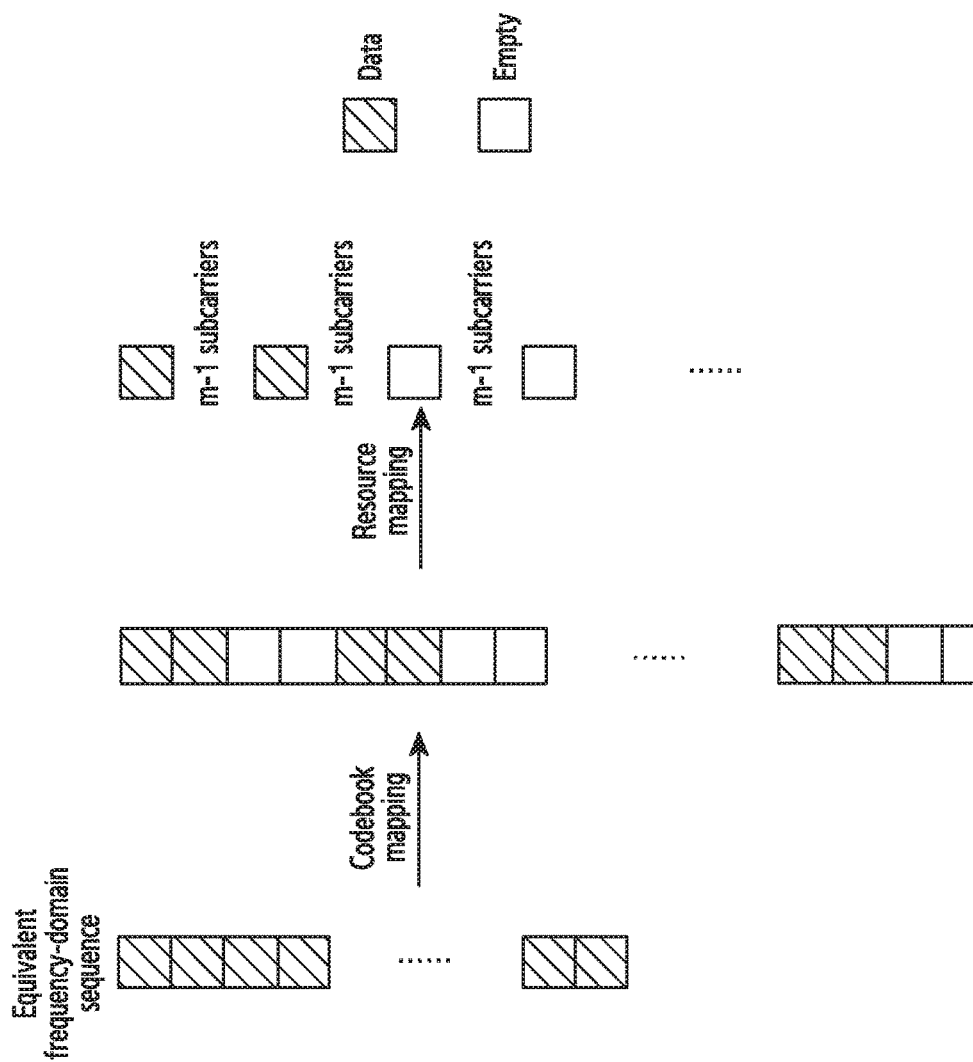
FIG. 8 illustrates a schematic diagram of codebook-based grid mapping.
Figure 9:
FIG. 9 illustrates single-carrier grid mapping in the form of time-domain grid mapping.
Figure 10:
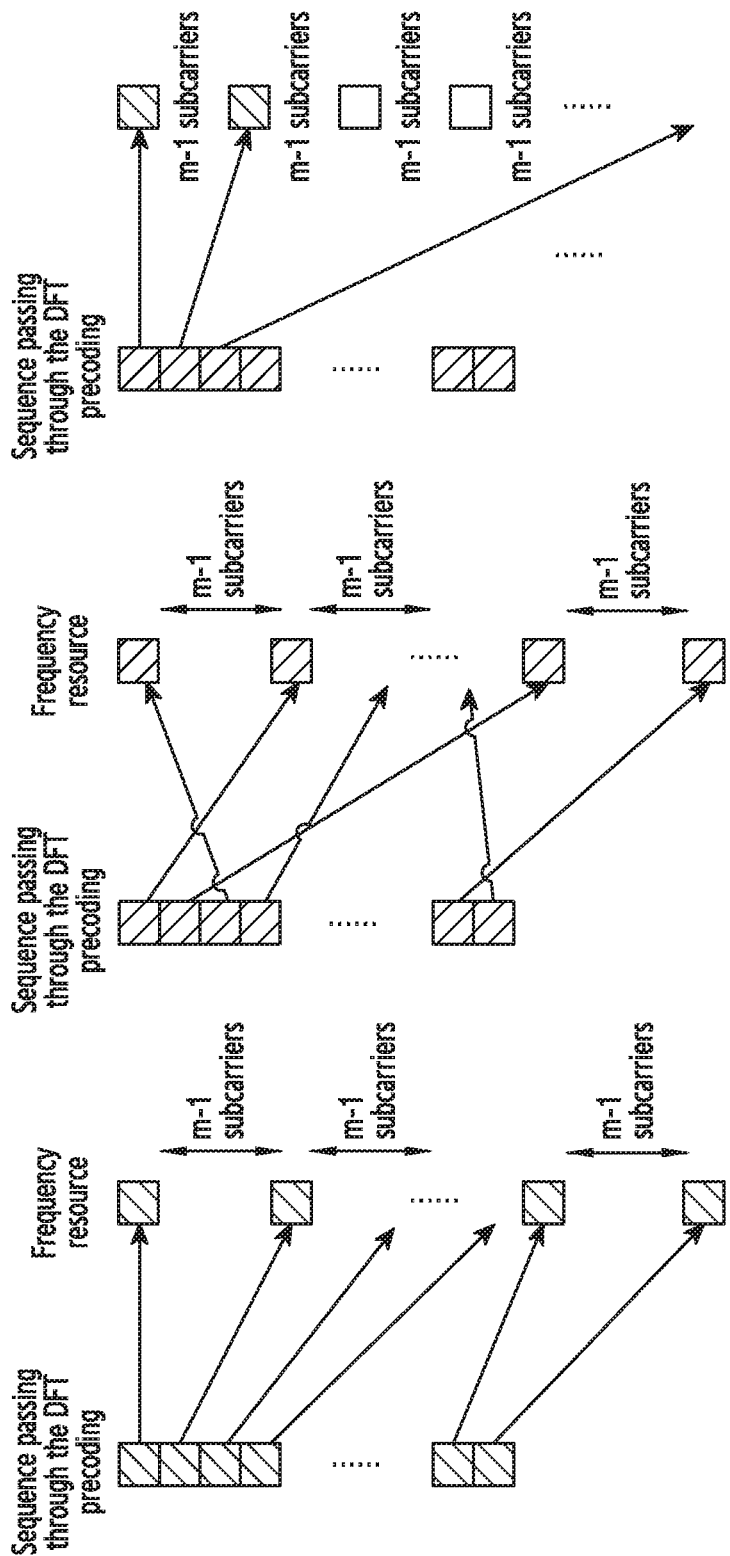
FIG. 10 illustrates a schematic diagram of three resource mapping modes.

Specifically, the resource mapping of FIG. 8 is used for mapping the sequence passing through the DFT precoding to frequency (subcarrier) resources having a distance m. As shown in FIG. 10, the way of the resource mapping comprises:

a. Sequential Mapping

The sequences passing through the DFT precoding are successively mapped to subcarriers having a distance m in order.

b. Pattern Mapping

According to the allocated pattern, the sequences passing through the DFT precoding are mapped to subcarriers having a distance m−1 in accordance with the mapping rule. Another implementation is as follows: first, interleaving is performed on the sequences passing through the DFT precoding according to the allocated symbol-level interleaving, and the sequences are mapped to subcarriers having a distance m−1.

c. Codebook Mapping

According to the allocated codebook, the sequences passing through the DFT precoding are mapped to subcarriers having a distance m−1 in a way specified by the codebook. For example, the codebook specifies the positions of $m_b$ non-zero subcarriers of $m_a$ successive subcarriers having a distance m−1. In this mode, the mode of acquiring the mapped sequence by spreading is included.

Further, the grid mapping can also be implemented in the following mode.

First, DFT precoding is performed; and then, frequency-domain grid mapping is performed on the sequences passing through the DFT precoding. The schematic diagram of this mode is as shown in FIG. 11.

Figure 11:
FIG. 11 illustrates a schematic diagram of another single-carrier grid mapping mode.

In FIG. 11, the symbol-level interleaving between the DFT precoding and the frequency-domain grid mapping is optional, and in some implementations, the symbol-level interleaving can be merged with the frequency-domain grid mapping. All the foregoing frequency-domain grid mapping modes can be used in such single-carrier grid mapping. In addition, the symbol-level interleaving can also be replaced with symbol-level scrambling, as another implementation.

Specifically, the number of DFT points in the DFT precoding is determined according to the allocated sub-band bandwidth and mapping distance. In the above embodiments, the description is given on the assumption that the subcarriers for data transmission can be evenly distributed over the whole bandwidth. However, in a practical system, it may be infeasible to use the entire bandwidth for transmission of the terminal services. In this case, it is useful to adjust and select the number of DFT points $N_{DFT}$ in the DFT precoding. Specifically, a range $[k_{min}, k_{max}]$ of subcarriers that can be allocated is calculated according to the bandwidth that can be occupied. There are $k_{use}=k_{max}-k_{min}+1$ subcarriers in this range. The number of DFT points $N_{DFT}=[k_{use}/m]$ in the DFT precoding in the single-carrier interleave-grid mapping is determined, according to the number of subcarriers and the mapping distance m allocated by the base station or randomly selected by the terminal. That is, the number of DFT points in the DFT precoding is selected according to the allocated sub-band bandwidth and mapping distance.

Embodiment 2

Figure 12:
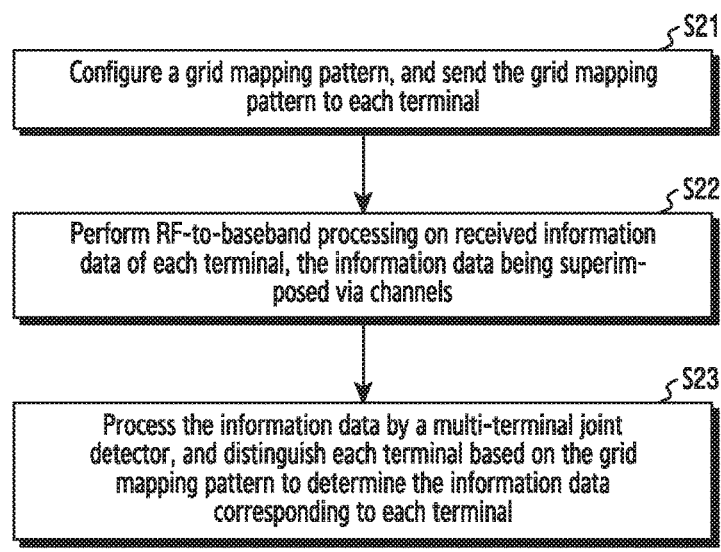
FIG. 12 illustrates a schematic diagram of a flow of a multi-terminal information receiving method based on grid mapping according to another embodiment of the present disclosure.

Correspondingly, referring to FIG. 12, the present disclosure also provides an embodiment of a multi-terminal information receiving method based on grid mapping, comprising the following steps of:

S21: configuring a grid mapping pattern, and transmitting the grid mapping pattern to each terminal, S22: performing RF-to-baseband processing on received information data of each terminal, the information data being superimposed via channels; and S23: processing the information data by a multi-terminal joint detector, and distinguishing each terminal based on the grid mapping pattern to determine the information data corresponding to each terminal.

The method further comprises: configuring a bit-level interleaving pattern and transmitting the bit-level interleaving pattern to each terminal, and distinguishing, by the multi-terminal joint detector, each terminal based on the corresponding bit-level interleaving pattern.

Figure 13:
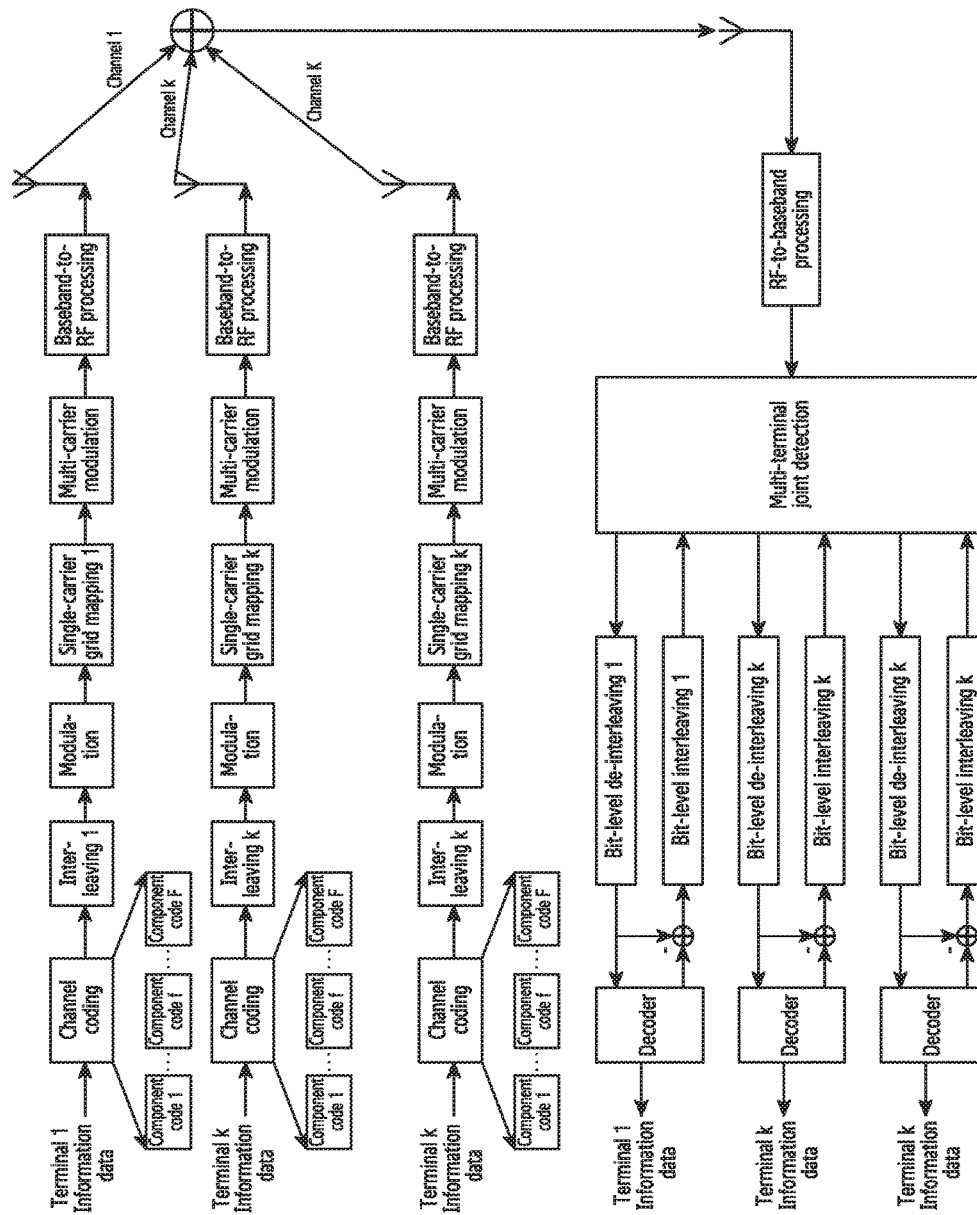
FIG. 13 illustrates a block diagram of a system supporting single-carrier interleave-grid multiple access.

FIG. 13 is a block diagram of a transmitter and a receiver of a system based on multi-terminal access scheme. In this embodiment, the multi-terminal information receiving method based on grid mapping will be explained in combination with this block diagram.

The system serves K terminals on the same time-frequency resources. Each terminal knows the single-carrier grid mapping pattern and/or the bit-level interleaving pattern used by the terminal by a broadcast channel, a control channel or a high-layer signaling. For a scheduling-free transmission system, the system can configure a resource pool by a broadcast channel, a control channel or a high-layer signaling. The resource pool contains single-carrier grid mapping patterns and/or bit-level interleaving patterns that can be selected. The terminal selects resources for transmission from the resource pool in an equal probability manner.

The terminal processes information data by the allocated single-carrier grid mapping pattern and/or bit-level interleaving pattern, and then transmits the information data. Upon receiving signals from K terminals which are polluted by channels and noise, the base station obtains information data of each terminal by a multi-terminal detection device (containing de-mapping with respect to the single-carrier grid mapping and demodulation with respect to the multi-carrier modulation) and by performing iteration between the detector and the decoder.

Wherein, the information data of each terminal is distributed across subcarriers having an equal distance, and each terminal implements the orthogonal allocation of resources by allocation onto different subcarriers. Further, the method further comprises: determining terminal groups based on a terminal implementing the orthogonal allocation of resources by allocation onto different subcarriers, and distinguishing each terminal group according to an orthogonal resource allocation mode.

Figure 14:
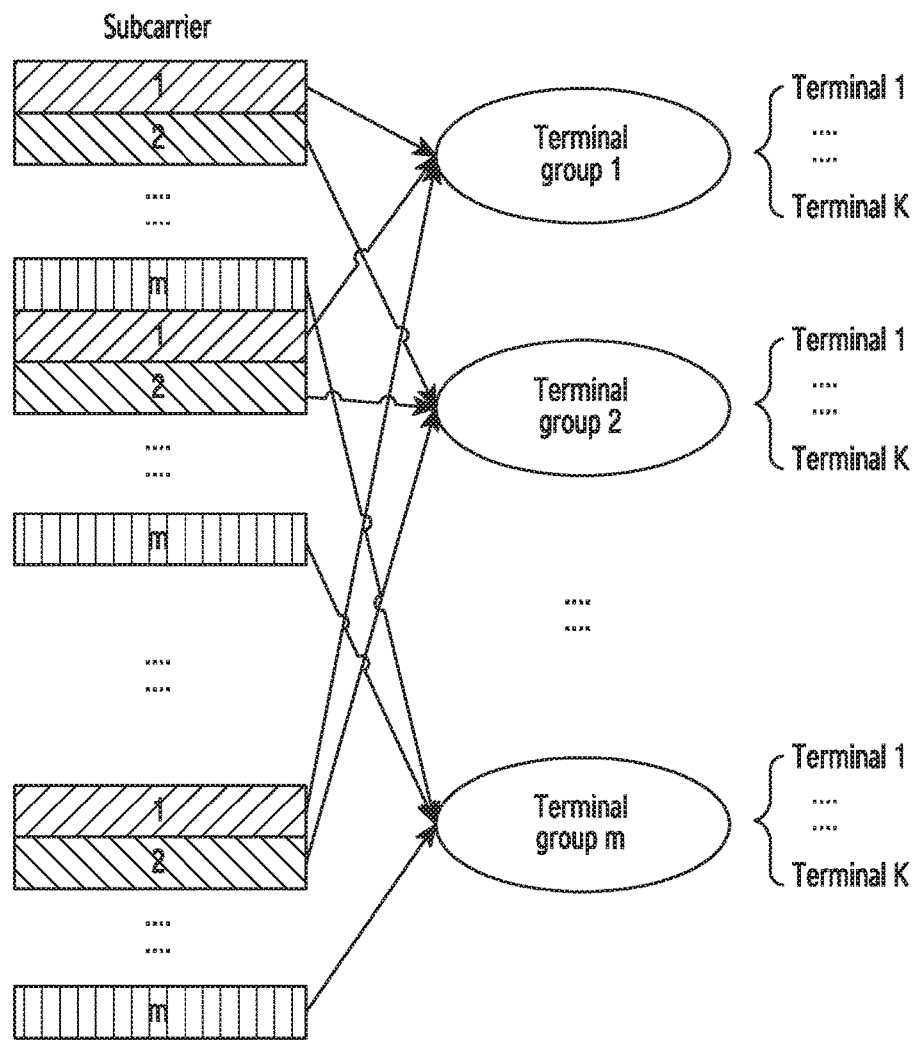
FIG. 14 illustrates terminal support in orthogonal and non-orthogonal forms.

Specifically, it can be seen from the description of Embodiment 1 that data of each terminal is evenly distributed cross discrete subcarriers. With this characteristic, different terminals can implement the orthogonal allocation of resources by allocation onto different subcarriers. Meanwhile, on those orthogonal resources, more terminals can be supported in a non-orthogonal way. In this embodiment, terminals on the orthogonal resources are called a terminal group. Terminals between the terminal groups are distinguished by the orthogonal resource allocation way, and terminals in a terminal group are distinguished by the non-orthogonal multiple access way. For example, when the terminal performs single-carrier grid mapping, the minimum mapping distance between the mapped subcarriers is m. In this case, there are m terminal groups in the time-frequency resources, and in each terminal group, K terminals can be supported in the non-orthogonal way. In this case, the number of terminals supported in the time-frequency resources is Km. The orthogonal and non-orthogonal terminal supporting ways are as shown in FIG. 14

The way of distinguishing different terminals in a same terminal group by a multi-terminal joint detector will be discussed below. Specifically:

1. Different terminals are distinguished by bit-level interleaving. That is, different terminals in a terminal group use same single-carrier grid mapping but a different bit-level interleaved sequence. Meanwhile, for optional symbol-level interleaving in the single-carrier grid mapping, different terminals can use a same symbol-level interleaved sequence, and may not use symbol-level interleaving.

Wherein, the bit-level interleaving can be replaced with bit-level scrambling. That is, different scrambling code sequences are allocated to different terminals, and different terminals are distinguished by different scrambling code sequences.

2. Different terminals are distinguished by the grid mapping pattern. That is, different terminals in a terminal group use same bit-level interleaving, or may not use bit-level interleaving. Different terminals are distinguished by different single-carrier interleave-grid mapping patterns.

It is to be noted that, the above two distinguishing ways can be combined. That is, different terminals use different bit-level interleaving and/or different single-carrier interleave-grid mapping patterns. One implementation of this mode is as follows: terminals are grouped by service type or service traffic, terminals in a same group use different single-carrier grid mapping patterns but a same bit-level interleaving pattern; and terminals in different groups use different bit-level interleaving patterns, and can use a same or different single-carrier grid mapping pattern. Or, terminals in a same group use different bit-level interleaving patterns, but a same single-carrier grid mapping pattern; and terminals in different groups use different single-carrier grid mapping patterns, and can use a same or different bit-level interleaving pattern.

The use of one or both of the above ways of distinguishing terminals can be adjusted according to the network load. When the network load is low, one way of distinguishing terminals may be sufficient. However, when the network load is high, it is useful to combine the two ways of distinguishing terminals to support more terminals. Specifically, when the network load is higher than a pre-defined threshold, it is useful to use both the bit-level interleaving pattern and the single-carrier grid mapping pattern to distinguish terminals; and if the network load is lower than the threshold, it is sufficient to use one way to distinguish terminals.

Specifically, the distinguishing different terminals in a terminal group based on the single-carrier interleave-grid mapping is implemented according to the used different symbol-level mapping and/or according to the different mapping ways in the frequency-domain grid mapping.

The implementations of various kinds of grid mapping have been described in Embodiment 1. Thereinafter, the ways of realizing different single-carrier interleave-grid mapping patterns in different implementations will be described, respectively.

Specifically, the distinguishing different terminals in a terminal group based on the grip mapping pattern is specifically implemented according to the used different symbol-level interleaving and/or according to the different mapping ways in the frequency-domain grid mapping. Wherein, the distinguishing according to different mapping modes in the frequency-domain grid mapping comprises any one of the following situations:

if frequency-domain grid mapping is performed by direct mapping, distinguishing different terminals by the distance between non-zero subcarriers in a terminal group;

if frequency-domain grid mapping is performed by codebook mapping, distinguishing different terminals by different codebooks; and if frequency-domain grid mapping is performed by zero-inserting, distinguishing different terminals by the different number of inserted zeros between the subcarriers.

Specifically:

a. Different symbol-level mapping is used.

b. In the frequency-domain grid mapping, if frequency-domain grid mapping is performed by direct mapping, different terminals can use different mapping distances. Specifically, if the mapping distance between non-zero subcarriers in the terminal group is m, on those non-zero subcarriers, different terminals can select n non-zero subcarriers having a distance for direct mapping, where n is an integer no less than 1. If n=1, it is indicated that direct mapping is performed on all available non-zero subcarriers. That is, terminals in a terminal group are distinguished by the distance between the non-zero subcarriers. This mode can be shown in FIG. 13. In FIG. 13, terminal 1 uses a mapping mode having a mapping distance of 2, i.e., the minimum mapping distance that can be used by this terminal group. Terminal 2 uses a greater mapping distance, i.e., n=2; and terminal 3 uses a mapping distance, i.e., n=4.

If frequency-domain grid mapping is performed by codebook mapping, different terminals can use different codebooks. That is, terminals in a terminal group are distinguished by the codebook.

If frequency-domain grid mapping is performed by zero-inserting, different terminals can use a different number of inserted zeros. However, the number of inserted zeros should ensure that the mapped non-zero subcarriers fall into the set of non-zero subcarriers in the terminal group.

The Mode a and Mode b can also be used together. That is, terminals are distinguished by symbol-level interleaving and single-carrier grid mapping. Specifically, more single-carrier grid mapping patterns are obtained by combinations of different symbol-level interleaving and different frequency-domain grid mapping, so that more terminals can be distinguished.

Optionally, the distinguishing different terminals in a same terminal group based on the grip mapping pattern is specifically implemented according to different mapping ways in the time-domain grid mapping and/or the resource mapping mode.

If single-carrier grid mapping is implemented by time-domain grid mapping (mode corresponding to FIG. 8), different single-carrier grid mapping patterns are obtained by different time-domain grid mapping and different resource mapping modes. Specifically, the distinguishing terminals by time-domain grid mapping comprises:

1. if zero-padding at the end of a symbol sequence and then interleaving are used, distinguishing different terminals by different symbol-level interleaved sequences;

2. if zero-padding at the end of a symbol sequence and then symbol-level scrambling are used, distinguishing different terminals by different symbol-level scrambled sequences;

3. if direct zero-inserting in a symbol sequence is used, distinguishing different terminals by different zero-inserting patterns;

4. if direct mapping is used, distinguishing different terminals by different mapping patterns and/or symbol-level interleaved sequences;

5. if direct mapping is used, distinguishing different terminals by different mapping patterns and/or symbol-level scrambled sequences;

6. if codebook mapping is used, distinguishing different terminals by different codebooks and/or symbol-level interleaved sequences; and 7. if codebook mapping is used, distinguishing different terminals by different codebooks and/or symbol-level scrambled sequences.

Further, the distinguishing terminals by the resource mapping mode comprises the following situations:

1. if sequential mapping is used, distinguishing different terminals by different mapping distances between the subcarriers;

2. if pattern mapping is used, distinguishing different terminals by different mapping patterns and/or different mapping distances between the subcarriers; and 3. if codebook mapping is used, distinguishing different terminals by different codebooks and/or different mapping distances between the subcarriers.

Figure 15:
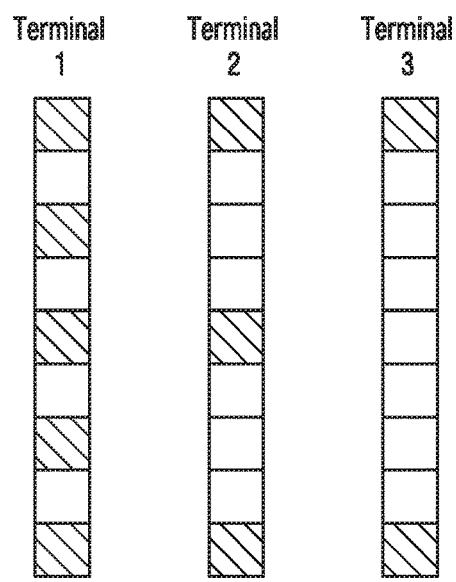
FIG. 15 illustrates mapping distances between the different subcarriers.

The way of using different subcarrier mapping distances by different terminals in the above description can refer to FIG. 15 and the related description. Furthermore, the distinguishing terminals by time-domain grid mapping and the distinguishing terminals by resource mapping can be combined. That is, more single-carrier grid mapping patterns are obtained by different time-domain grid mapping patterns and resource mapping modes, so as to support more terminals.

In addition, the symbol-level interleaving in the above description can be replaced with symbol-level scrambling.

Embodiment 3

In order to further describe the multi-terminal joint detector of Embodiment 2, the structure of a multi-terminal joint detector applicable to the present disclosure and a corresponding detection algorithm will be introduced in this embodiment. The structure of a multi-terminal joint detector in this embodiment is as shown in FIG. 16.

Figure 16:
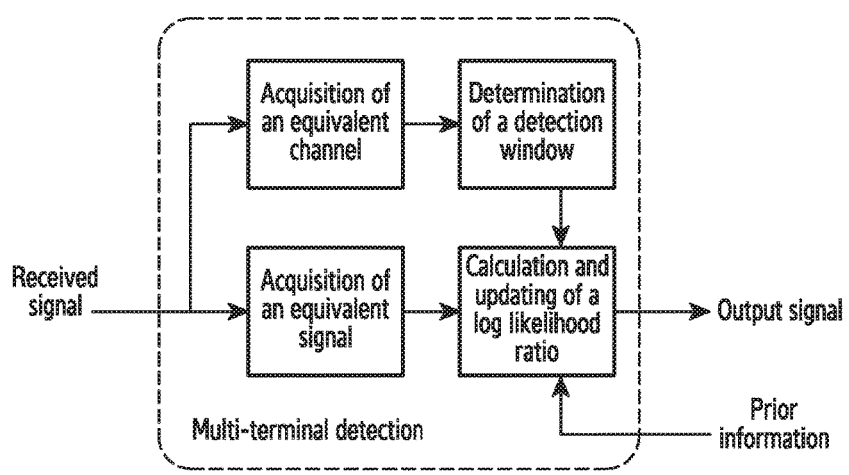
FIG. 16 illustrates a structure diagram of a multi-terminal detector.

In FIG. 16, the multi-terminal detector receives signals from a multiple of terminals, which are polluted by channels and noise and superposed, and prior information from a multiple of channel decoders, which is composed of a multiple of terminal information estimations; and outputs posterior information of a multiple of pieces of terminal information, for being used in the subsequent decoding and other steps.

The multi-terminal detector of the present disclosure is applicable to single-carrier interleave-grid multiple access of the present disclosure, and also applicable to interleave-grid multiple access based on the SC-FDMA waveform. In the block diagram of FIG. 16, the acquisition of an equivalent signal is used for extracting equivalent received signals from a terminal group, which are superposed together, according to the received signals; the acquisition of an equivalent channel is used for acquiring equivalent channel state information of a terminal group according to a reference signal inserted in a transmitted signal; a detection window determines a signal for being used in the subsequent calculation of a log likelihood ratio; and the calculation and updating of the log likelihood ratio is used for calculating and updating output information to be subsequently decoded by a decoder, according to the equivalent received signal, the equivalent channel coefficient and the detection window, which are all acquired by the above modules.

To better describe the working principle and flow of the detector of this embodiment of the present disclosure, the following assumption is made. A sequence to be transmitted, after passing through the symbol modulation, from terminal k is $x_k = [x_1^k, \ldots, x_{N_{DFT}}^k]^T$, where $N_{DFT}$ is the length of the sequence to be transmitted. Wherein, the length of sequences from different terminals can be different. Herein, for ease of description, it is assumed that the length of sequences to be transmitted from the terminals is the same.

The single-carrier grid mapping of the $k^{th}$ terminal is performed by a matrix $P_k \in C^{N_{IDFT} \times N_{DFT}}$. According to different ways of implementing single-carrier grid mapping, the forms of the mapping matrix $P_k$ are also different. For example, if DFT precoding is performed first and then frequency-domain grid mapping, the mapping matrix is $P_k = G_k F_{N_{DFT}}$, where $F_{N_{DFT}} \in C^{N_{DFT} \times N_{DFT}}$ is a $N_{DFT}$-point DFT matrix, and $G_k \in C^{N_{IDFT} \times N_{DFT}}$ is the frequency-domain grid mapping matrix expression of the $k^{th}$ terminal. If time-domain grid mapping is performed first, then DFT precoding and finally resource mapping, the mapping matrix is $P_k = G_k F_{N_{DFT}} T_k$, where $G_k \in C^{N_{IDFT} \times N_{DFT}}$ is the resource mapping matrix expression of the $k^{th}$ terminal, $T_k \in C^{N_{DFT} \times N_k}$ is the time-domain grid mapping expression of the $k^{th}$ terminal, and $N_k$ is the length of the sequence before the time-domain grid mapping. The transmitted sequence from the $k^{th}$ terminal is denoted by: $s_k = F_{N_{IDFT}}^{-1} P_k x_k = [s_1, \ldots, s_{N_{IDFT}}]^T$, where $F_{N_{IDFT}}^{-1} \in C^{N_{IDFT} \times N_{IDFT}}$ is a $N_{IDFT}$-point DFT matrix. The sequence, after being added with a CP, is transmitted to the receiver.

After passing through channel and removing CP, the equivalent time-domain multi-path channel, can be expressed in a Toeplitz matrix. For example, for terminal k, the equivalent time-domain channel having a multi-path length $l_k$ is:

$$H_k \in C^{N_{IDFT} \times N_{IDFT}} = \begin{bmatrix} h_1^k & 0 & \ldots & h_{l_k}^k & \ldots & h_2^k \\ \vdots & h_1^k & \ldots & 0 & \ldots & \vdots \\ h_{l_k}^k & \vdots & \ldots & \vdots & \ldots & h_{l_k}^k \\ 0 & h_{l_k}^k & \ldots & h_{l_k}^k & \ldots & \vdots \\ \vdots & \vdots & \ldots & \vdots & \ldots & 0 \\ 0 & 0 & \ldots & h_{l_k-1}^k & \ldots & h_1^k \end{bmatrix}$$

A signal received by the $r^{th}$ receiving antenna of the receiver is a signal obtained by superposing signals from K terminals. The signal, after being removed off the CP, is specifically expressed by:

$$y^r = [y_1^r, \ldots, y_{N_{IDFT}}^r]^T = \sum_{k=1}^K H_k s_k + n$$

where, vector n is a noise vector.

For ease of description, the processing flow of the receiver when there is a single receiving antenna will be described first. Furthermore, the superscript r in $y^r$ is removed. The processing steps when there are multiple receiving antennas are simple expansions of the processing flow when there is a single receiving antenna. Wherein, the multi-terminal joint detector comprises executing the following processes.

1. Acquisition of an Equivalent Signal

The flow of acquiring an equivalent signal is as shown in FIG. 16, comprising the following steps: multi-carrier demodulation and single-carrier grid de-mapping.

The multi-carrier demodulation is multi-carrier demodulation performed according to the multi-carrier modulation mode used by the terminal, including the removal of the CP.

The signal extraction is to perform reverse operations according to operations after the DFT precoding in the single-carrier grid mapping of the $k^{th}$ terminal, and to perform reverse DFT precoding.

Specifically, multi-carrier demodulation is performed on the received signal y. Taking OFDM demodulation as an example, since the removal of the CP is included in the description, the subsequent operation of the OFDM demodulation is to perform DFT. The DFT can be implemented in the form of FFT. The frequency-domain symbol sequence passing through the multi-carrier demodulation is: $y_f = F_{N_{IDFT}} y_f$. Wherein, $F_{N_{IDFT}}$ is a $N_{IDFT}$-point DFT matrix. For terminal k, the symbol sequence passing through the signal extraction is $r_k = F_{N_{DFT}}^{-1} \overline{G}_k y_f$, where $\overline{G}_k$ represents the reverse mapping of the frequency-domain grid mapping (or resource mapping) of the $k^{th}$ terminal, and $F_{N_{DFT}}^{-1}$ is a $N_{DFT}$-point IDFT matrix. If all terminals have a same operation after the DFT precoding, a same operation can be used to complete the signal extraction step.

2. Acquisition of an Equivalent Channel

According to the results of channel estimation, operations before the DFT precoding in the single-carrier interleave-grid mapping are combined to obtain an equivalent channel estimation for detection. Specifically, the obtained equivalent channel estimation for terminal K can be expressed by:

$$\overline{H}_k = F_{N_{DFT}}^{-1} \overline{G}_k F_{N_{IDFT}} H_k F_{N_{IDFT}}^{-1} G_k F_{N_{DFT}} \in C^{N_{DFT} \times N_{DFT}}$$

That is, for the $k^{th}$ terminal, an equivalent channel, passing through the DFT precoding, the frequency-domain grid mapping (or resource mapping), a multi-carrier modulation, channels, multi-carrier demodulation at the receiving end, signal extraction, and reverse DFT precoding, is estimated. As the channel, frequency-domain estimation can be performed by the frequency-domain reference signal inserted by the transmitter to obtain a frequency-domain channel $F_{N_{IDFT}} H_k F_{N_{IDFT}}^{-1}$, and then the above equivalent channel is obtained according to the frequency-domain grid mapping pattern (or resource mapping pattern) for the $k^{th}$ terminal.

3. Determination of a Detection Window

It can be seen from the above equivalent channel estimation and equivalent signal estimation that, for one symbol of one terminal, due to multi-path spreading, this symbol may influence a multiple of symbols of the equivalent signal. If all equivalent signals are taken into consideration, the detection complexity will be significantly increased, which is disadvantageous for the implementation of this scheme. Therefore, it is useful to determine the size of the detection window. By rationally defining the detection window, the detection complexity and the performance can be balanced.

Specifically, for each terminal, it is useful to define an observation window, the length of which is $L_{obv}$, indicating the number of equivalent signals to be considered when the estimated value of each transmitted symbol is calculated; and to define an interference window, the length of which is $L_{int}$, indicating the number of symbols of each terminal, which will cause interference to the symbol, to be considered when the estimated value of each transmitted symbol is calculated. When the $n^{th}$ symbol of terminal k is detected, according to the definition of the length of the observation window, an observation sequence $r_k^n$ and an observation equivalent channel $\overline{H}_k^r$ are obtained.

There can be following two methods for evaluating the observation window.

a. obtaining the observation window and the observation equivalent channel by taking a symbol to be detected as a center; and b. obtaining the observation window and the observation equivalent channel by taking a symbol to be detected as a starting point.

4. Calculation and Updating of a Log Likelihood Ratio

To decrease the detection complexity, it is assumed that interference and noise follow the Gaussian distribution. It is useful to calculate the mean and variance of interferences from other terminals, when a log likelihood ratio is calculated.

The mean of the transmitted symbol estimations of the terminal calculated according to the prior information of the previous iteration is $\{\overline{x}_k\}_{k=0}^K$, and the variance is $\{\sigma_k^2\}_{k=0}^K$. The way of calculating the mean and variance of the transmitted symbol estimations according to the prior information can refer to literature [Li Ping, Lihai Liu, K. Y. Wu, and W. K. Leung, Interleave-Division Multiple-Access (IDMA) Communications].

According to the definition of the observation window, for the $n^{th}$ symbol, the mean of the transmitted symbol estimations in the observation window is $\{\overline{x}_k^n\}_{k=0}^K$, and the variance is $\{\sigma_{k,n=0}^2\}_{k=0}^K$.

For the $n^{th}$ symbol from the $k^{th}$ terminal, interference and noise follow the Gaussian distribution. The distribution function can be expressed by:

$$p(r_k^n|s_k=s_q) = A\exp\{-(r_k^n - I_k^n - \overline{h}_k^r s_q)^H R^{-1}(r_k^n - I_k^n - \overline{h}_k^r s_q)\}$$

where, $I_k^n = \Sigma_{k'=1, k'\neq k}^K \overline{H}_k^r \overline{x}_k^n$ is the interference estimation, and $R = \sigma^2 I + \Sigma_{k'=1, k'\neq k} \overline{H}_k^r \text{diag}(\sigma_{k,n}^2) \overline{H}_k^{rH}$ is the interference variance estimation; where, $\sigma^2$ is the noise variance; and I is an identity matrix diag(x), indicating a diagonal matrix using vector x as the diagonal element; and A is a normalized parameter.

The output log likelihood ratio is obtained according to the distribution function and the prior information of the previous iteration.

It is to be noted that if different terminals do not perform frequency-domain grid mapping (or resource mapping) specific to the terminals after the DFT precoding, that is, different terminals use the same frequency-domain grid mapping (or resource mapping), or different terminals do not perform interleaving or scrambling of the order of symbols after the DFT precoding, the signal extraction step can be collectively performed. if different terminals perform the change of the mapping distance between the subcarriers after the DFT precoding, the signal extraction step can also be collectively performed. However, in this case, the number of DFT points used to perform the DFT precoding by terminals using different mapping distances is different. Therefore, in the signal extraction step, for the reverse DFT precoding, a reverse DFT precoding matrix which is corresponding to a mapping mode having a minimum mapping distance between the subcarriers is used. For a terminal using the DFT precoding with a large mapping distance, the symbol sequence passing through the reverse DFT precoding is the periodical repetition of its own symbol sequence. When the mean and variance of the symbol sequence are constructed by the prior information, it is useful to consider the periodicity resulted from different mapping distances between the subcarriers. That is, the number of DFT points for terminal k1 using the minimum mapping distance between the subcarriers is $N_{DFT}$, and the mean and variance of the symbols constructed by the prior information are $\overline{x}_{k1} = [x_0^{k1}, \ldots, x_{N_{DFT}-1}^{k1}]^T$ and $\sigma_{k1}^2 = [\sigma_0^{k1}, \ldots, \sigma_{N_{DFT}-1}^{k1}]^T$, respectively. The number of DFT points for terminal k2 using a mapping distance which is twice the minimum mapping distance between the subcarriers is $N_{DFT}/2$, the mean and variance of the symbols constructed by the prior information are $\overline{x}_{k2} = [x_0^{k2}, \ldots, x_{N_{DFT}/2-1}^{k2}]^T$ and $\sigma_{k1}^2 = [\sigma_0^{k2}, \ldots, \sigma_{N_{DFT}/2-1}^{k2}]^T$, respectively, and the mean and variance of the symbols for detection are $[x_0^{k2}, \ldots, x_{N_{DFT}/2-1}^{k2}, \ldots, x_{N_{DFT}/2-1}^{k2}]^T$ and $[\sigma_0^{k2}, \ldots, \sigma_{N_{DFT}/2-1}^{k2}, \sigma_0^{k2}, \ldots, \sigma_{N_{DFT}/2-1}^{k2}]^T$, that is, the mean and variance of the symbols during the detection are repeated twice. The number of DFT points for a terminal using a mapping distance which is m times of the minimum mapping distance between the subcarriers is $N_{DFT}/m$. During the detection, the mean and variance of the symbols constructed by the prior information are to be repeated for m times. In the subsequent equivalent channel matrix acquisition and log likelihood ratio calculation steps, no additional processing is required. After the log likelihood ratios are obtained, the obtained results are to be merged according to the number of repetitions (i.e, added), to obtain log likelihood ratios for $N_{DFT}/m$ symbols.

For a receiver having many antennas, the received signal can be separately processed by each antenna and the obtained log likelihood ratios can be merged (i.e., added), or, the acquisition of an equivalent signal, the acquisition of an equivalent channel and the determination of a detection window are performed separately for each antenna, and the received signals of the many antennas are considered when the distribution function is calculated.

Embodiment 4

In this embodiment, a multi-terminal multi-stream information transmission mode based on grid mapping of the present disclosure will be briefly introduced.

Figure 19:
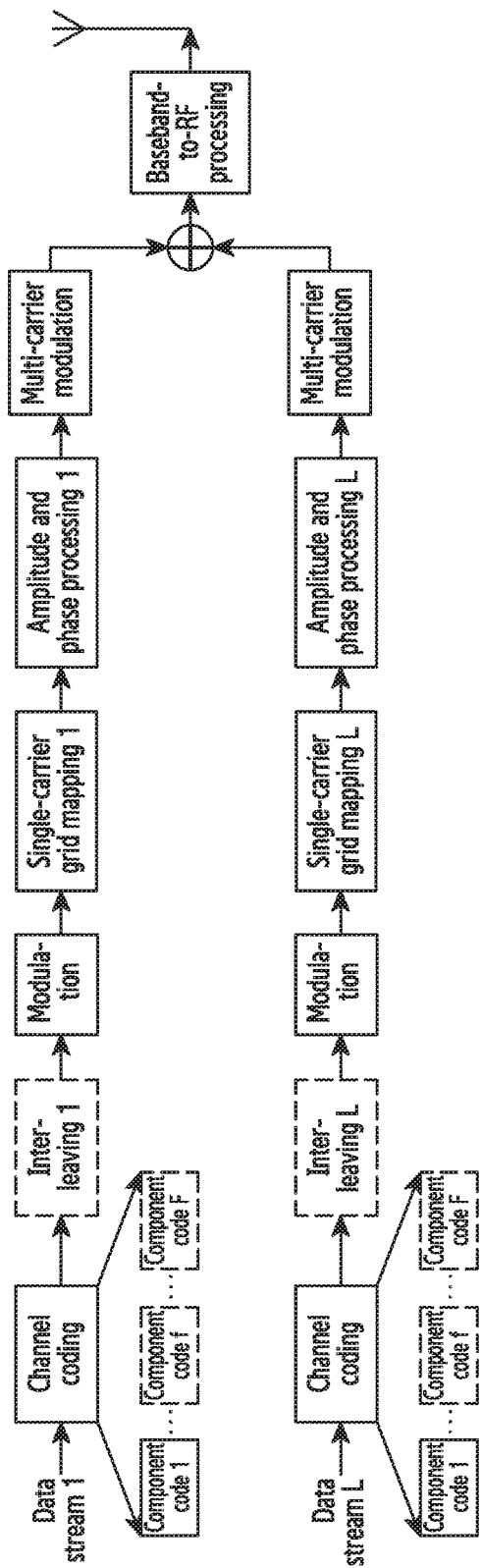
FIG. 19 illustrates a block diagram of a transmitter during multi-stream transmission.
Figure 20:
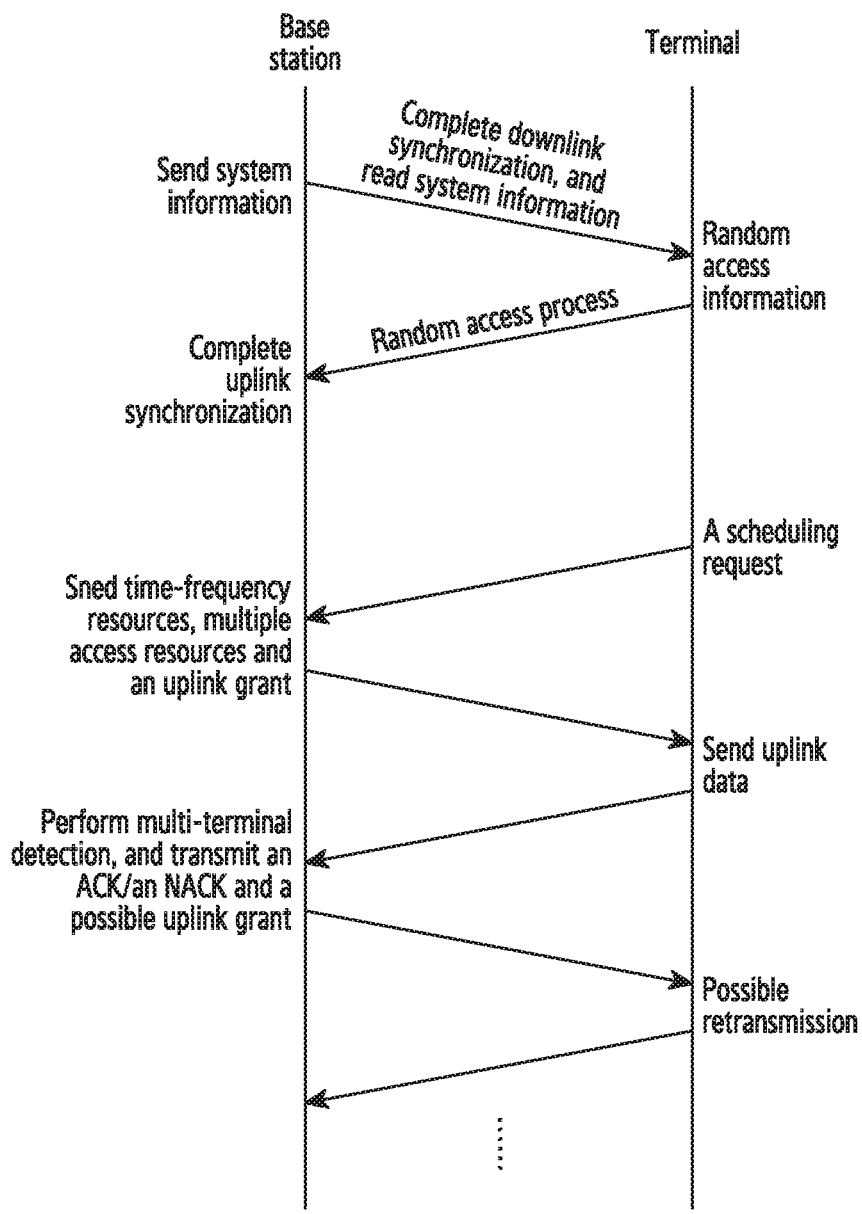
FIG. 20 illustrates a scheduling-based transmission and communication flow.

In the above embodiments, it is assumed that each terminal has single-stream transmission. When the volume of data to be transmitted by the terminal is large, single-stream transmission may be not enough for the data transmission demand of the terminal. In this case, one possible way of increasing the data rate is that the terminal adopts multi-stream transmission. When the terminal adopts multi-stream transmission, the block diagram of the transmitter is shown in FIG. 19.

Figure 17:
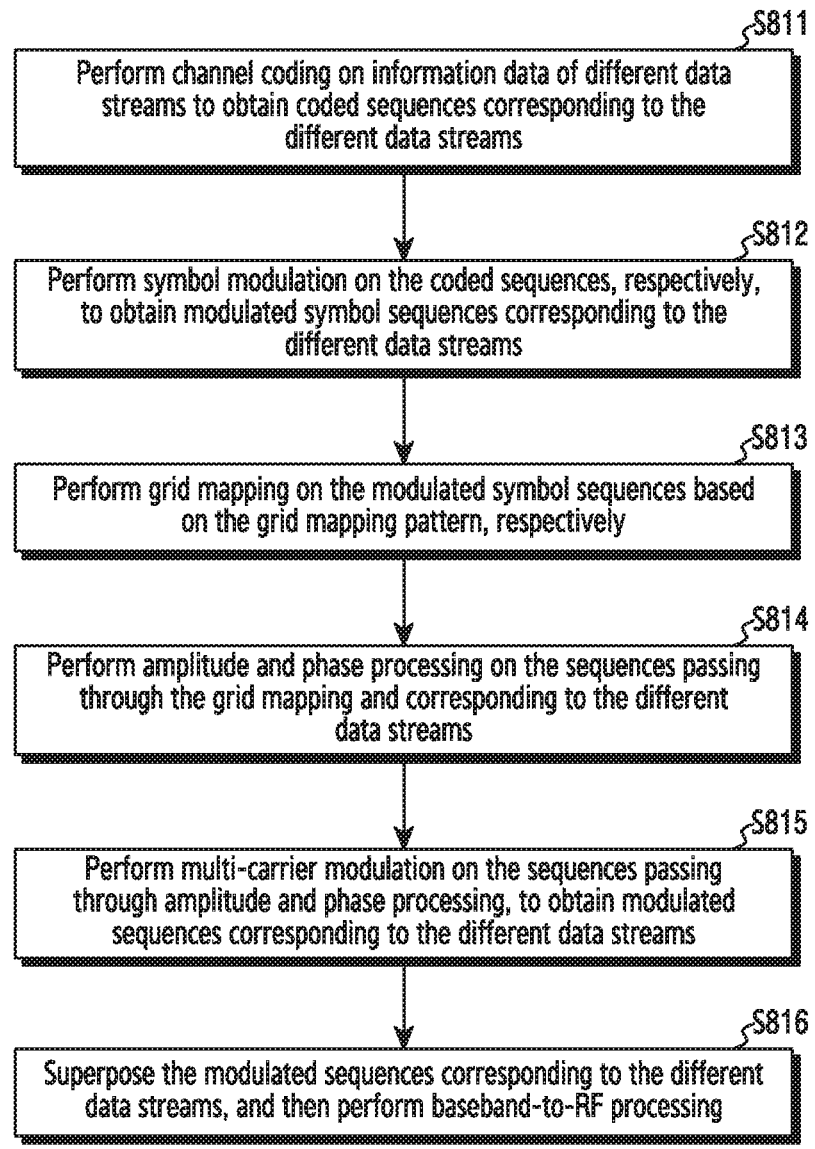
FIG. 17 illustrates a schematic diagram of a flow of processing a multiple of data streams from a same terminal according to the present disclosure.
Figure 18:
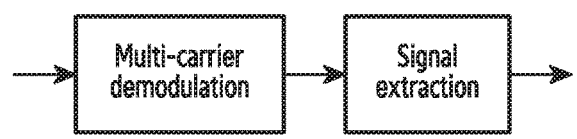
FIG. 18 illustrates the acquiring of an equivalent signal.

Further, as shown in FIG. 17, when a same terminal contains a multiple of data streams, the multiple of data streams from this terminal are processed by the following steps:

S811: performing channel coding on information data of different data streams to obtain coded sequences corresponding to the different data streams;

S812: performing symbol modulation on the coded sequences, respectively, to obtain modulated symbol sequences corresponding to the different data streams;

S813: performing grid mapping on the modulated symbol sequences based on the grid mapping pattern, respectively;

S814: performing amplitude and phase processing on the sequences passing through the grid mapping and corresponding to the different data streams;

S815: performing multi-carrier modulation on the sequences passing through amplitude and phase processing, to obtain modulated sequences corresponding to the different data streams; and S816: superposing the modulated sequences corresponding to the different data streams, and then performing baseband-to-RF processing.

Further, it also comprises: after performing amplitude and phase processing on the sequences passing through the grid mapping and corresponding to the different data streams, respectively, superposing the processing results corresponding to the different data streams, then performing multi-carrier modulation on the superposed results, and finally performing baseband-to-RF processing on the sequences passing through the multi-carrier modulation.

The terminal transmitter used for multi-stream transmission is shown in FIG. 16. A terminal has L data streams to be transmitted, and each data stream uses a different single-carrier grid mapping pattern and/or bit-level interleaved sequence. The respective bit-level interleaving, modulation, the respective of single-carrier grid mapping, corresponding amplitude and phase processing, and multi-carrier modulation are performed on each data. After those processing, the signals are merged (added) and passed through baseband-to-RF processing, and then transmitted by antennas. It is to be noted that the data streams, after passing through the amplitude and phase modulation, can be merged (added) first and then passed through multi-carrier processing.

The amplitude and phase processing is used for changing amplitude and/or phase of the symbols passing through the grid mapping, so that the equivalent channels at the receiver for different data streams are different. Wherein, the amplitude and phase processing includes the change of amplitude, phase, or both. The amplitude and phase processing of the first data stream is implemented by multiplying the symbols passing through the single-carrier grid mapping by a factor $\alpha_l$. One possible criterion for selecting the factor $\alpha_l$ is that the minimum Euclidian distance between all possible transmitted symbol selections is caused to be the largest. For example, for two-stream QPSK constellation transmission, one possible amplitude and phase factor value is:

TABLE 1

Amplitude and phase factor corresponding to
each stream during two-stream transmission

| | |
|---|---|
| $\alpha_1$ | $1/\sqrt{5}$ |
| $\alpha_2$ | $2/\sqrt{5}$ |

In this case, after the adjustment according to the amplitude and phase factor in Table 1, a transmission constellation having 16 points is equivalently formed, similar to 16QAM transmission.

For three-stream QPSK constellation transmission, one possible amplitude and phase factor value is:

TABLE 2

Amplitude and phase factor corresponding to
each stream during three-stream transmission

| | |
|---|---|
| $\alpha_1$ | $1/\sqrt{21}$ |
| $\alpha_2$ | $2/\sqrt{21}$ |
| $\alpha_3$ | $4/\sqrt{21}$ |

In this case, after the adjustment according to the amplitude and phase factor in Table 2, a transmission constellation having 64 points is equivalently formed, similar to 64QAM transmission.

After the desired factor is obtained according to the criteria of causing the minimum Euclidian distance to be the largest, amplitude adjustment is performed. For other types of constellations, for example PSK or more, adjustment in both amplitude and phase may be performed, i.e., a case where there are plural adjustment factors. The selection of other amplitude and phase factors is also possible. For example, points in the resulting equivalent constellation are caused to close to Gaussian distribution, or more.

The method further comprises: receiving a configured bit-level interleaving pattern by a broadcast channel, a control channel or a high-layer signaled resource pool, and performing bit-level interleaving on the coded sequence based on the bit-level interleaving pattern to obtain a corresponding bit-level interleaved sequence.

For a same terminal, different streams use different single-carrier grid mapping patterns and/or different bit-level interleaving patterns. Different streams in a same terminal use a same single-carrier grid mapping pattern and/or a different bit-level interleaving pattern. Different terminals use different single-carrier grid mapping patterns. When performing multi-terminal detection, the base station distinguishes terminals by the single-carrier grid mapping pattern and distinguishes different streams from a same terminal by the bit-level interleaved sequence. Among different terminals, the bit-level interleaved sequences can be the same or different.

Or, different streams from a same terminal use a same bit-level interleaved sequence and a different single-carrier grid mapping pattern. When performing multi-terminal detection, the base station distinguishes terminals by the bit-level interleaved sequence and distinguishes different streams from a same terminal by the single-carrier grid mapping pattern. Different terminals can use a same or different single-carrier grid mapping pattern.

Or, different streams from different terminals use different bit-level interleaved sequences and different single-carrier grid mapping patterns. When performing multi-terminal detection, the base station distinguishes different streams from different terminals by the bit-level interleaved sequence and the single-carrier grid mapping pattern.

In addition, if different terminals use a same bit-level interleaved sequence or do not use a bit-level interleaved sequence, different streams from different terminals use different single-carrier grid mapping patterns. If different terminals use a same single-carrier grid mapping pattern, different streams from different terminals use different bit-level interleaved sequences.

In a case where there is one data stream but the data stream is relatively long, first, channel coding, bit-level interleaving and modulation are performed on the data stream; the modulated data stream is converted to a multiple of data streams by series-to-parallel conversion, each data stream using a different single-carrier grid mapping pattern;

data from different data streams are merged and passed through the multi-carrier modulation and baseband-to-RF processing; or the stream sequences, passing through the single-carrier grid mapping, are passed through the multi-carrier modulation and then merged, and baseband-to-RF processing is performed on the merged data stream. When performing detection, the receiver distinguishes terminals by the bit-level interleaving and distinguishes streams according to the single-carrier grid mapping pattern.

Another mode is as follow: the data stream is passed through channel coding and then converted into a multiple of data streams by series-to-parallel conversion. Processing is performed in the way shown in FIG. 16.

Embodiment 5

To further describe the method of the above embodiment, the way of combining the multi-terminal information transmitting method based on grid mapping according to the present disclosure with the multi-antenna technology will be briefly introduced in this embodiment.

When a terminal is equipped with a multiple of transmitting antennas, the improvement of the transmission efficiency and/or transmission reliability of the system can be achieved by the combination with the multi-antenna technology. The information transmitting method for multi-terminal access according to the present disclosure can also be combined with the multi-antenna technology.

One simplest combination way is as follows: when the terminal has a single data stream for transmission, the data stream is passed through the channel coding, optional bit-level interleaving, modulation and single-carrier grid mapping, and then converted into a multiple of data streams by series-to-parallel conversion; layer mapping and preprocessing are performed on the data streams by the multi-antenna technology, and the data streams, after passing through the multi-carrier modulation, are transmitted by a multiple of transmitting antennas. Wherein, the preprocessing includes space-frequency coding, space-time coding, selection of a precoding matrix according to the channel feedback, or more. This transmission way is equivalently a simple combination of the single-carrier interleave-grid multiple access and the multi-antenna technology. All the ways of distinguishing terminals in Embodiment 2 are applicable.

Another combination way is as follows: when the terminal has a multiple of data streams for transmission, the data streams are respectively passed through the respective channel coding, bit-level interleaving, modulation and single-carrier grid mapping and layer mapping and preprocessing are performed on the data streams by the multi-antenna technology to form a multiple of data streams to be transmitted. Those data streams, after passing through the respective multi-carrier modulation, are transmitted by a multiple of transmitting antennas. In this way, different data streams from different terminals can be distinguished by different single-carrier grid mapping patterns and/or bit-level interleaving patterns. Specifically, different data streams from a same terminal can use different bit-level interleaving patterns, but a same single-carrier grid mapping pattern; and different terminals use different single-carrier grid mapping patterns, and can use a same or different bit-level interleaved sequence. Or, different data streams from a same terminal can use different single-carrier grid mapping patterns, but a same bit-level interleaved sequence; and different terminals use different bit-level interleaved sequences, and can use a same or different single-carrier grid mapping pattern. Or, different streams from different terminals use different single-carrier grid mapping patterns and different bit-level interleaved sequences.

The multiple of data streams can also be obtained by performing series-to-parallel conversion on a same data stream. Or, a same data stream is passed through channel coding and converted to a multiple of data streams by series-to-parallel conversion. The data streams are passed through the respective bit-level interleaving, modulation and single-carrier grid mapping; layer mapping and preprocessing are performed on the data streams to form a multiple of data streams to be transmitted; and the data streams to be transmitted are respectively passed through the multi-carrier modulation and then transmitted. Or, a same data stream is passed through the channel coding, bit-level interleaving and modulation, and then converted to a multiple of data streams by series-to-parallel conversion; the data streams are passed through the single-carrier grid mapping; layer mapping and preprocessing are performed on the data streams to form a multiple of data streams to be transmitted; and the data streams to be transmitted are respectively passed through the multi-carrier modulation and then transmitted. In the last situation, one terminal can use one bit-level interleaving pattern. A feasible way of distinguishing different data streams from different terminals is: distinguishing different data streams from different terminals by different single-carrier grid mapping patterns, or distinguishing terminals by bit-level interleaving and distinguishing different data streams from a same terminal by the single-carrier grid mapping pattern.

Another combination way with the multi-antenna technology is as follows: when the terminal has a multiple of data streams for transmission, after the data streams are respectively passed through the respective channel coding, bit-level interleaving, modulation and the respective single-carrier grid mapping, the respective amplitude and phase adjustment is performed on each data stream, and then the data streams are superposed. Layer mapping and preprocessing are performed on the superposed data streams to obtain a multiple of data streams to be transmitted; and the data streams to be transmitted are passed through the multi-carrier modulation and then transmitted. This combination way is equivalent to a combination of a single-carrier interleave-grid multiple access mode for multi-stream transmission and the multi-antenna technology. The amplitude and phase adjustment is used for adjusting the amplitude and phase of each data stream passing through the single-carrier grid mapping, so that there is a large minimum Euclidean distance between the points of the superposed equivalent constellation. One way of implementing the amplitude and phase adjustment is to multiply each data stream by a corresponding amplitude and phase adjustment factor.

Different data streams from different terminals are distinguished by the single-carrier grid mapping and/or bit-level interleaving. Specifically, different data streams from a same terminal can use different bit-level interleaving patterns, but a same single-carrier grid mapping pattern; and different terminals use different single-carrier grid mapping patterns, and can use a same or different bit-level interleaved sequence. Or, different data streams from a same terminal can use different single-carrier grid mapping patterns, but a same bit-level interleaved sequence; and different terminals use different bit-level interleaved sequences, and can use a same or different single-carrier grid mapping pattern. Or, different streams from different terminals use different single-carrier grid mapping patterns and different bit-level interleaved sequences.

The multiple of data streams can also be obtained by performing series-to-parallel conversion on a same data stream. Or, a same data stream is passed through channel coding and converted to a multiple of data streams by series-to-parallel conversion. Then, the data streams are passed through the respective bit-level interleaving, modulation and single-carrier grid mapping, multiplied by a respective amplitude and phase adjustment factor, and then superposed; and then layer mapping and preprocessing are performed on the data streams to form a multiple of data streams to be transmitted; and the data streams to be transmitted are respectively passed through the multi-carrier modulation and then transmitted. Or, a same data stream is passed through the channel coding, bit-level interleaving and modulation, and then converted to a multiple of data streams by series-to-parallel conversion; the data streams are passed through the single-carrier grid mapping, multiplied by a respective amplitude and phase adjustment factor, and then superposed; layer mapping and preprocessing are performed on the data streams to form a multiple of data streams to be transmitted; and the data streams to be transmitted are respectively passed through the multi-carrier modulation and then transmitted. In the last situation, one terminal can use one bit-level interleaving pattern. A feasible way of distinguishing different data streams from different terminals is: distinguishing different data streams from different terminals by different single-carrier grid mapping patterns, or distinguishing terminals by bit-level interleaving and distinguishing different data streams from a same terminal by the single-carrier grid mapping pattern.

The above combination ways with the multi-antenna technology can be combined together. For example, some of data streams use the second combination way in which the data streams are processed independently, while some of data streams use the third combination way in which the data streams are superposed and then processed.

Embodiment 6

To further describe the method of the above embodiment, a communication flow between a multiple of terminals and a base station in the multi-terminal information receiving and transmitting methods based on grid mapping according to the present disclosure will be briefly introduced in this embodiment.

The communication between terminals using single-carrier interleave-grid multiple access and the base station can be scheduling-based communication, and can also be scheduling-free communication.

For terminals using the scheduling-based communication way, the working flow is as follows:

first, a terminal completes downlink synchronization by a downlink control channel, acquires system information and information about a random access channel by a broadcast channel;

the terminal completes uplink synchronization by a random access process, and acquires ID information of the terminal;

when the terminal has uplink data to be transmitted, the terminal transmits a scheduling request by an uplink control channel or an uplink shared channel;

upon receiving the scheduling request, the base station allocates time-frequency resources and multiple access resources to the terminal according to the current network load condition, the scheduling condition of the existing time-frequency resources, and the scheduling condition of multiple access resources on the existing time-frequency resources. Wherein, for single-carrier interleave-grid multiple access, the multiple access resources comprise: a terminal group on the time-frequency resources, a bit-level interleaved sequence, and a single-carrier grid mapping pattern. Wherein, the terminal group comprises: a minimum mapping distance when subcarrier mapping is performed on the time-frequency resources, and the mapping position of the first subcarrier. The minimum mapping distance decides the number of terminal groups on the time-frequency resources, and the mapping position of the first subcarrier decides the positions of the terminal groups. Another informing way is to inform the number of terminal groups and an index of a terminal group. The terminal knows the specific allocation results by the number of terminal groups and the index of a terminal group. Meanwhile, the base station can schedule a multiple of terminals onto the same time-frequency resources. Different terminals are distinguished by the resource allocation to different terminal groups and the different single-carrier grid mapping and/or bit-level interleaved sequences in a same terminal group.

The base station transmits an uplink transmission grant and corresponding time-frequency resources and multiple access resources in a downlink control channel. Upon receiving the uplink grant and the time-frequency resources and multiple access resources, the terminal transmits uplink data on the corresponding time-frequency resources and multiple access resources.

Upon receiving the uplink data, the base station performs multi-terminal detection, obtains data from different terminals according to the time-frequency resources and multiple access resources, and decides whether the data detection is correct according to the Cyclic Redundancy Check (CRC). The base station transmits an ACK signal if the data detection is correct, and transmits an NACK signal if the data detection is not correct. For retransmission, the base station will estimate whether a conflict may occur if the time-frequency resources and multiple access resources for the previous transmission are used to transmit the retransmitted data. The base station does not transmit an uplink grant and resource allocation information, if no conflict may occur; and the base station transmits an uplink grant, a retransmission indication, and resource allocation information containing time-frequency resources and multiple access resources, if a conflict may occur.

The terminal detects an HARQ indication channel in the downlink channel. If an ACK signal is detected, the terminal ends this transmission. If an NACK signal is detected and no grant information is received, the terminal uses the previously allocated resources including time-frequency resources and multiple access resources to transmit the retransmitted information. If uplink grant information and retransmitted information are detected, the terminal uses the newly allocated resources including time-frequency resources and multiple access resources to transmit the retransmitted information. The flow can be as shown in FIG. 17.

Another communication way is scheduling-free communication. In this scheduling way, one possible way is that the terminal completes uplink synchronization by the downlink synchronization and the random access process, and acquires information such as ID of the terminal. The base station allocates multiple access resources and reference signals to different terminals according to the network load condition, and configures them by high-layer signaling. Wherein, the multiple access resource comprises terminal group information on the same time-frequency resources, and single-carrier grid mapping pattern information and/or bit-level interleaved sequence in a terminal group.

When the terminal has data to be transmitted, the terminal randomly selects, according to the allocated multiple access resources and the reference signals, time-frequency resources for scheduling-free transmission to transmit the data. The base station performs blind multi-terminal detection on the received data, to obtain the uplink data transmitted by the terminal.

Another possible scheduling-free transmission way is as follows: the terminal performs downlink synchronization and knows the resource pool information of the system by a downlink control channel, a downlink shared channel or a broadcast channel. The resource pool contains multiple access resource information for non-orthogonal multiple access, reference signal information, and/or time-frequency resource information.

When the terminal has data to be transmitted, the terminal randomly selects resources from the resource pool in an equal probability manner, and transmits uplink data. The base station performs blind multi-terminal detection on the received data, to obtain the detection results of the uplink data.

Embodiment 7

Figure 21:
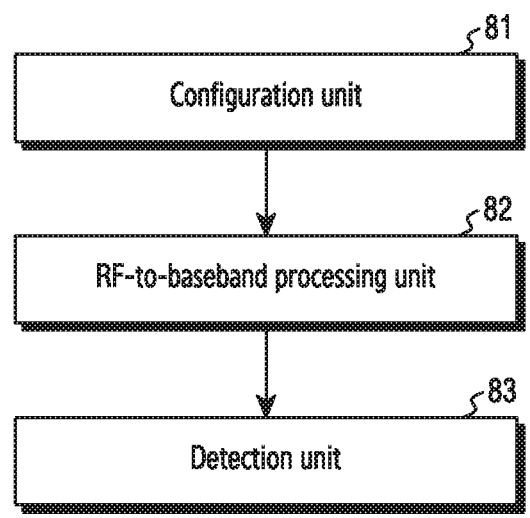
FIG. 21 illustrates a structure block diagram of a multi-terminal information receiving apparatus based on grid mapping according to still another embodiment of the present disclosure.

On the basis of the multi-terminal information receiving method based on grid mapping in Embodiment 2 and Embodiment 3, this embodiment provides a multi-terminal information receiving apparatus based on grid mapping. As shown in FIG. 21, the apparatus comprises a configuration unit 81, a RF-to-baseband processing unit 82, and a detection unit 83.

Specifically, the configuration unit 81 is used for configuring a grid mapping pattern, and transmitting the grid mapping pattern to each terminal; the RF-to-baseband processing unit 82 is used for performing RF-to-baseband processing on received information data of each terminal, the information data being superimposed via channels; and the detection unit 83 for processing the information data by a multi-terminal joint detector based on the grid mapping pattern to obtain the processed information data corresponding to each terminal.

In the solution of the present disclosure, the implementations of the specific functions of modules in the multi-terminal information receiving apparatus based on grid mapping in Embodiment 7 can refer to the specific steps of the multi-terminal information receiving method based on grid mapping in Embodiment 2 and Embodiment 3, and will not be repeated here.

Embodiment 8

Figure 22:
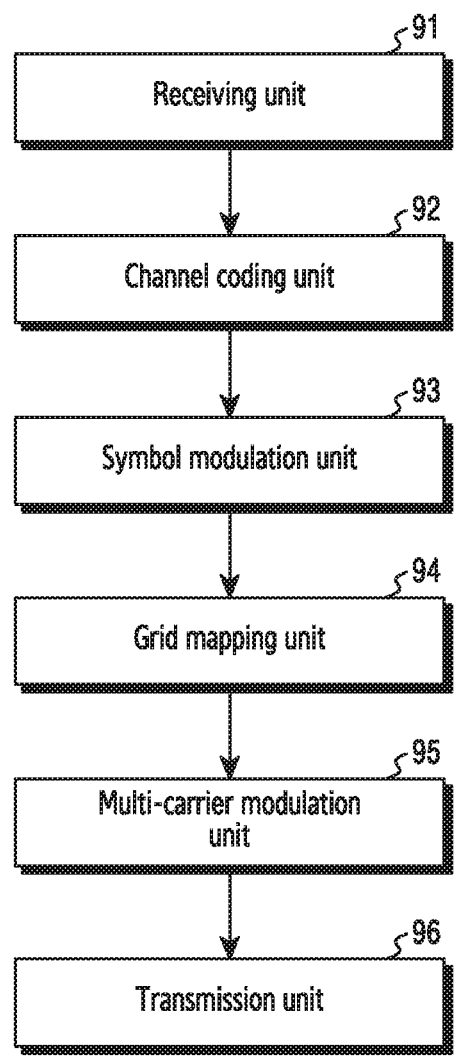
FIG. 22 illustrates a structure block diagram of a multi-terminal information transmitting apparatus based on grid mapping according to yet another embodiment of the present disclosure.

On the basis of the multi-terminal information transmitting method based on grid mapping in Embodiment 1, Embodiment 4 and Embodiment 5, this embodiment provides a multi-terminal information transmitting apparatus based on grid mapping. As shown in FIG. 22, the apparatus comprises a receiving unit 91, a channel coding unit 92, a symbol modulation unit 93, a grid mapping unit 94, a multi-carrier modulation unit 95, and a transmission unit 96.

Specifically, the receiving unit 91 is used for receiving a configured grid mapping pattern; the channel coding unit 92 is used for performing channel coding on information data to obtain a corresponding coded sequence; the symbol modulation unit 93 is used for performing symbol modulation on the coded sequence to obtain a modulated symbol sequence; the grid mapping unit 94 is used for performing grid mapping on the modulated symbol sequence based on the grid mapping pattern; the multi-carrier modulation unit 95 is used for performing multi-carrier modulation on the sequence passing through the grid mapping to obtain a corresponding modulated sequence; and the transmission unit 96 is used for performing baseband-to-RF processing on the modulated sequence, and then transmitting the sequence.

In the solution of the present disclosure, the implementations of the specific functions of modules in the multi-terminal information transmitting apparatus based on grid mapping in Embodiment 8 can refer to the specific steps of the multi-terminal information transmitting method based on grid mapping in Embodiment 1, Embodiment 4 and Embodiment 5, and will not be repeated here.

Figure 23:
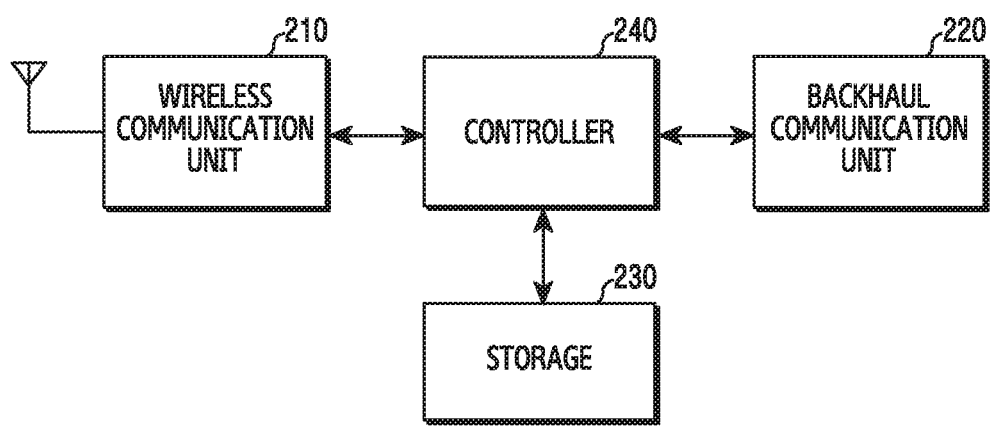
FIG. 23 illustrates an example configuration of a multi-terminal information receiving apparatus in a wireless communication system according to an exemplary embodiment of the present disclosure.

FIG. 23 illustrates an example configuration of a multi-terminal information receiving apparatus in a wireless communication system according to an exemplary embodiment of the present disclosure. The multi-terminal information receiving apparatus may comprise, for example, a base station. Hereinafter, the term "unit" or the term ending with the suffix "-er" or "-or" refer to a unit for processing at least one function or operation and these terms may be implemented by using hardware or software or a combination of hardware and software.

Referring to FIG. 23, the multi-terminal information receiving apparatus includes a wireless communication interface 2310, a backhaul communication interface 2320, a storage 2330, and a controller 2340.

The wireless communication interface 2310 performs functions for transmitting and receiving signals via a radio channel. For example, the wireless communication interface 2310 performs a function of converting between a baseband signal and a bit string according to a physical layer standard of a system. For example, when transmitting data, the wireless communication interface 2310 generates complex symbols by encoding and modulating a transmission bit string. In addition, when receiving data, the wireless communication interface 2310 restores a reception bit string by demodulating and decoding a baseband signal. In addition, the wireless communication interface 2310 up-converts a baseband signal into a radio frequency (RF) band signal and then transmit the RF band signal through an antenna, and down-converts an RF band signal received through the antenna into a baseband signal.

For example, the wireless communication interface 2310 may include a transmission filter, a reception filter, an amplifier, a mixer, an oscillator, a digital to analog converter (DAC), an analog-to-digital converter (ADC), or the like. In addition, the wireless communication interface 2310 may include at least one antenna array configured by a plurality of antenna elements. In view of hardware, the wireless communication interface 2310 may be configured by a digital unit and an analog unit, and the analog unit may be configured by a plurality of sub-units according to operation power and operation frequency.

The wireless communication interface 2310 transmits and receives signals as described above. Accordingly, the wireless communication interface 2310 may be referred to as a transmission interface, a reception interface, a transmission and reception interface, a transmitter, a receiver or a transceiver. In addition, in the following description, transmitting and receiving performed through a radio channel may include processing by the wireless communication interface 2310 as described above.

The backhaul communication interface 2310 provides an interface for communication with other nodes in a network. That is, the backhaul communication interface 2310 converts a bit string to be transmitted from the multi-terminal information receiving apparatus to another node, for example, another access node, another multi-terminal information receiving apparatus, a core network, or the like into a physical signal, and converts a physical signal received from another node into a bit string.

The storage 2330 stores data such as a basic program, an application program, setting information, or the like for the operation of the multi-terminal information receiving apparatus. The storage 2330 may be configured by a volatile memory, a nonvolatile memory, or a combination of a volatile memory and a nonvolatile memory. The storage 2330 provides the stored data according to a request of the storage 2330 and the controller 2340.

The controller 2340 controls overall operations of the multi-terminal information receiving apparatus. For example, the controller 2340 transmits and receives signals through the wireless communication interface 2310 or the backhaul communication interface 2320. In addition, the controller 2340 records and reads data on and from the storage 2330. The controller 2340 may perform functions of a protocol stack which a communication standard requires. To achieve this, the controller 2340 may include at least one processor. According to an exemplary embodiment of the present disclosure, the controller 2340 may includes configuration unit 81, RF-to-baseband processing unit 82, and detection unit 83. Here, configuration unit 81, RF-to-baseband processing unit 82, and detection unit 83 may be a command/code resided in the controller 2340, storage space that stores the command/code, or a part of circuitry configuring the controller 2340.

According to exemplary embodiments of the present disclosure, the controller 2340 may configure grid mapping patterns for a plurality of terminals, transmit, to the plurality of terminals, the grid mapping patterns, and receive, from the plurality of terminals, information in which a grid mapping is performed based on the grid mapping patterns, and identify data of the information corresponding to each of the plurality of terminals based on the grid mapping patterns. For example, the controller 2340 may control the multi-terminal information receiving apparatus to perform operations according to the exemplary embodiments of the present disclosure.

Figure 24:
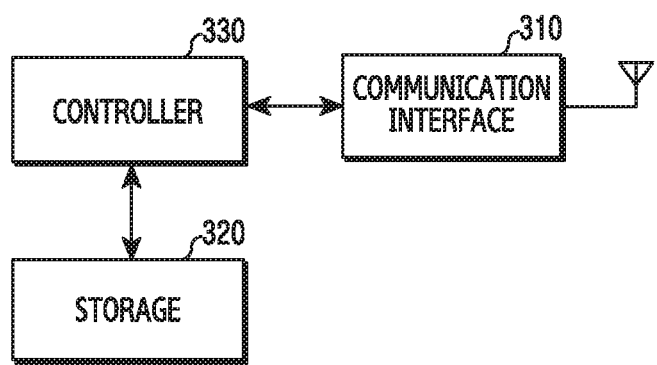
FIG. 24 illustrates an example configuration of a multi-terminal information transmitting apparatus in a wireless communication system according to an exemplary embodiment of the disclosure.

FIG. 24 illustrates an example configuration of a multi-terminal information transmitting apparatus in a wireless communication system according to an exemplary embodiment of the disclosure. The multi-terminal information transmitting apparatus may comprise, for example, a terminal. Hereinafter, the term "unit" or the term ending with the suffix "-er" or "-or" refer to a unit for processing at least one function or operation and these terms may be implemented by using hardware or software or a combination of hardware and software.

Referring to FIG. 24, the multi-terminal information transmitting apparatus includes a communication interface 2410, a storage 2420, and a controller 2430.

The communication interface 2410 performs functions for transmitting and receiving signals via a radio channel. For example, the communication interface 2410 performs a function of converting between a baseband signal and a bit string according to a physical layer standard of a system. For example, when transmitting data, the communication interface 2410 generates complex symbols by encoding and modulating a transmission bit string. In addition, when receiving data, the communication interface 2410 restores a reception bit string by demodulating and decoding a baseband signal. In addition, the communication interface 2410 up-converts a baseband signal into an RF band signal and then transmit the RF band signal through an antenna, and down-converts an RF band signal received through the antenna into a baseband signal. For example, the communication interface 2410 may include a transmission filter, a reception filter, an amplifier, a mixer, an oscillator, a DAC, an ADC, or the like.

The communication interface 2410 may include a plurality of transmission/reception paths. The communication interface 2410 may include at least one antenna array configured by a plurality of antenna elements. In view of hardware, the communication interface 2410 may be configured by a digital circuitry and an analog circuitry (e.g., radio frequency integrated circuit (RFIC)). Here, the digital circuitry and analog circuitry may be implemented as one package. Also, the communication interface 2410 may include a plurality of RF chain. The communication interface 2410 may perform beamforming.

Also, the communication interface 2410 may include different communication modules for processing signals of different frequency band. The communication interface 2410 may include a plurality of communication modules for supporting a plurality of different wireless access technologies. For example, the plurality of different wireless access technologies may include Bluetooth low energy (BLE), wireless fidelity (Wi-Fi), Wi-Fi gigabyte (WiGig), cellular network (e.g., long term evolution (LTE)), or the like. Also, different frequency bands may include super high frequency (SHF) (e.g., 2.5 GHz, 5 GHz) band and millimeter wave (e.g., 60 GHz).

The wireless communication interface 2410 transmits and receives signals as described above. Accordingly, the communication interface 2410 may be referred to as a transmission interface, a reception interface, a transmission and reception interface, a transmitter, a receiver or a transceiver. In addition, in the following description, transmitting and receiving performed through a radio channel may include processing by the communication interface 2410 as described above.

The storage 2420 stores data such as a basic program for the operation of the multi-terminal information transmitting apparatus, an application program, setting information, or the like. The storage 2410 may be configured by a volatile memory, a nonvolatile memory, or a combination of a volatile memory and a nonvolatile memory. In addition, the storage 2420 provides stored data in response to a request of the controller 2430.

The controller 2430 controls overall operations of the multi-terminal information transmitting apparatus. For example, the controller 2430 transmits and receives signals through the communication interface 2410. In addition, the controller 2430 records and reads data on and from the storage 2420. The controller 2430 may perform functions of a protocol stack which the communication standard requires. To achieve this, the controller 2430 may include at least one processor or microprocessor or may be a part of the processor. In addition, a part of the communication interface 2410 and the controller 2430 may be referred to as a communication processor (CP). According to exemplary embodiments of the present disclosure, the controller 2430 may include receiving unit 91, channel coding unit 92, symbol modulation unit 93, grid mapping unit 94, and multi-carrier modulation unit 95. Here, receiving unit 91, channel coding unit 92, symbol modulation unit 93, grid mapping unit 94, and multi-carrier modulation unit 95 may be a command/code resided in the controller 2430, storage space that stores the command/code, or a part of circuitry configuring the controller 2430.

According to exemplary embodiments of the present disclosure, the controller 2430 may receive a grid mapping pattern configured by a base station, generate data based on the grid mapping pattern, and transmit the data to the base station. For example, the controller 2430 may control the multi-terminal information transmitting apparatus to perform operations according to the exemplary embodiments of the present disclosure.

The descriptions above are just some implementations of the present disclosure. It should be noted that, for a person of ordinary skill in the art, various improvements and embellishments can be made without departing from the principle of the present disclosure, and those improvements and embellishments shall be regarded as falling into the protection scope of the present disclosure.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for operating a base station, the method comprising:
    transmitting, to a terminal, information regarding a grid mapping comprising a subcarrier distance for the terminal;
    receiving information comprising precoded data from the terminal on subcarriers and precoded data from one or more other terminals; and
    obtaining the precoded data from the terminal based on the subcarrier distance for the terminal,
    wherein the precoded data from the terminal comprises data to which a discrete Fourier transform (DFT) precoding is applied, and
    wherein the precoded data from the terminal is mapped to the subcarriers so that a distance between each pair of adjacent subcarriers among the subcarriers is the subcarrier distance for the terminal.

2. The method of claim 1, wherein the obtaining the precoded data from the terminal comprises obtaining the precoded data from the terminal based on a bit-level interleaving pattern configured by the base station.

3. The method of claim 1, wherein the obtaining the precoded data from the terminal comprises obtaining the precoded data from the terminal based on a scrambling code sequence for a bit-level scrambling configured by the base station.

4. The method of claim 1, further comprising:
    if a network load is greater than a pre-defined threshold, identifying terminals in a same terminal group by using a bit-level interleaving pattern and the grid mapping at a same time or by using a scrambling code sequence and the grid mapping at a same time; and
    if the network load is less than the pre-defined threshold, identifying the terminals in the same terminal group by using at least one of the bit-level interleaving pattern, the scrambling code sequence, or the grid mapping.

5. The method of claim 1, further comprising:
    processing the received information by a multi-terminal joint detector.

6. The method of claim 1, further comprising:
    identifying different data streams from different terminals in a same terminal group based on at least one of a bit-level interleaving pattern or a grid mapping pattern.

7. The method of claim 1, wherein another subcarrier distance different from the subcarrier distance for the terminal is configured for the one or more other terminals, and
    wherein the precoded data from the one or more other terminals is mapped to other subcarriers so that a distance between each pair of adjacent subcarriers among the other subcarriers is the other subcarrier distance for the one or more other terminals.

8. An apparatus of a base station, the apparatus comprising:
    at least one transceiver configured to:
        transmit, to a terminal, information regarding a grid mapping comprising a subcarrier distance for the terminal, and
        receive information comprising precoded data from the terminal on subcarriers and precoded data from one or more other terminals; and
    at least one processor configured to obtain the precoded data from the terminal based on the subcarrier distance for the terminal,
    wherein the precoded data from the terminal comprises data to which a discrete Fourier transform (DFT) precoding is applied, and
    wherein the precoded data from the terminal is mapped to the subcarriers so that a distance between each pair of adjacent subcarriers among the subcarriers is the subcarrier distance for the terminal.

9. The apparatus of claim 8, wherein the at least one processor is further configured to obtain the precoded data from the terminal based on a bit-level interleaving pattern configured by the base station.

10. The apparatus of claim 8, wherein the at least one processor is further configured to obtain the precoded data from the terminal based on a scrambling code sequence for a bit-level scrambling configured by the base station.

11. The apparatus of claim 8, wherein the at least one processor is further configured to:
    if a network load is greater than a pre-defined threshold, identify terminals in a same terminal group by using a bit-level interleaving pattern and the grid mapping at a same time or by using a scrambling code sequence and the grid mapping at a same time; and
    if the network load is less than the pre-defined threshold, identify the terminals in the same terminal group by using at least one of the bit-level interleaving pattern, the scrambling code sequence, or the grid mapping.

12. The apparatus of claim 8, wherein the at least one processor is further configured to process the received information by a multi-terminal joint detector.

13. The apparatus of claim 8, wherein the at least one processor is further configured to identify different data streams from different terminals in a same terminal group based on at least one of a bit-level interleaving pattern or a grid mapping pattern.

14. The apparatus of claim 8, wherein another subcarrier distance different from the subcarrier distance for the terminal is configured for the one or more other terminals, and
    wherein the precoded data from the one or more other terminals is mapped to other subcarriers so that a distance between each pair of adjacent subcarriers among the other subcarriers is the other subcarrier distance for the one or more other terminals.

15. An apparatus of a terminal, the apparatus comprising:
    at least one transceiver configured to receive, from a base station, information regarding a grid mapping comprising a subcarrier distance for the terminal; and
    at least one processor configured to obtain precoded data by applying a discrete Fourier transform (DFT) precoding to data,
    wherein the at least one transceiver is further configured to transmit, to the base station, the precoded data on subcarriers, wherein the precoded data is mapped to the subcarriers so that a distance between each pair of adjacent subcarriers among the subcarriers is the subcarrier distance for the terminal, and wherein the precoded data is identified by the base station based on the subcarrier distance for the terminal.

16. The apparatus of claim 15, wherein, if the terminal transmits a multiple of data streams, the at last one processor is further configured to:

perform channel coding on information of different data streams to obtain coded sequences corresponding to the different data streams;

perform symbol modulation on the coded sequences, respectively, to obtain modulated symbol sequences corresponding to the different data streams;

perform a grid mapping on the modulated symbol sequences based on the subcarrier distance respectively;

perform amplitude and phase processing on the sequences on which the grid mapping is performed corresponding to the different data streams;

perform multi-carrier modulation on the sequences on which the amplitude and the phase processing are performed to obtain modulated sequences corresponding to the different data streams;

superpose the modulated sequences on which the multi-carrier modulation is performed corresponding to the different data streams; and perform baseband-to-RF processing.

17. The apparatus of claim 16, wherein the at least one processor is further configured to:

perform a DFT precoding on the modulated symbol sequences, respectively, to obtain corresponding equivalent frequency-domain sequences, and then perform a frequency-domain grid mapping; and perform a time-domain grid mapping on the modulated symbol sequences, then perform the DFT precoding after the grid mapping, and perform a resource mapping on results of the DFT precoding so that the obtained results are mapped to subcarrier resources having a specific distance between each subcarrier resource.

18. The apparatus of claim 15, wherein, if the terminal transmits a multiple of data streams, the at last one processor is further configured to:

perform channel coding on information of different data streams to obtain coded sequences corresponding to the different data streams;

perform symbol modulation on the coded sequences, respectively, to obtain modulated symbol sequences corresponding to the different data streams;

perform a grid mapping on the modulated symbol sequences based on a grid mapping pattern, respectively;

perform amplitude and phase processing on the sequences on which the grid mapping is performed corresponding to the different data streams;

superpose the modulated sequences on which the amplitude and the phase processing are performed corresponding to the different data streams;

perform multi-carrier modulation on the superposed sequences to obtain modulated sequences corresponding to the different data streams; and perform baseband-to-RF processing.

19. The apparatus of claim 15, wherein the at least one transceiver is further configured to receive a configured bit-level interleaving pattern, and performing a bit-level interleaving on the data based on the bit-level interleaving pattern.

20. The apparatus of claim 19, wherein the grid mapping and the bit-level interleaving pattern used by different data streams from a same terminal are different, and the grid mapping and the bit-level interleaving pattern used by different data streams from different terminals are different.

* * * * *